(12) United States Patent
Sasaki et al.

(10) Patent No.: US 8,422,269 B2
(45) Date of Patent: Apr. 16, 2013

(54) SEMICONDUCTOR MEMORY DEVICE

(75) Inventors: Takahiko Sasaki, Tokyo (JP); Tomonori Kurosawa, Zama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 269 days.

(21) Appl. No.: 13/033,151

(22) Filed: Feb. 23, 2011

(65) Prior Publication Data

US 2011/0235394 A1    Sep. 29, 2011

(30) Foreign Application Priority Data

Feb. 25, 2010  (JP) ................................. 2010-040408
Mar. 24, 2010  (JP) ................................. 2010-068101

(51) Int. Cl.
*G11C 11/00*  (2006.01)

(52) U.S. Cl.
USPC ........... 365/148; 365/163; 365/158; 365/171; 365/173; 365/226

(58) Field of Classification Search .................. 365/148, 365/163, 158, 171, 173, 226, 189.09
See application file for complete search history.

(56) References Cited

U.S. PATENT DOCUMENTS 7,133,312 B2  11/2006  Sakimura et al.
7,292,471 B2  11/2007  Sakimura et al.
7,480,167 B2 *  1/2009  Ahn .............................. 365/148
2008/0316798 A1 *  12/2008  Tanizaki et al. .............. 365/148
2010/0309715 A1 *  12/2010  Choi ............................ 365/163

FOREIGN PATENT DOCUMENTS

JP    2008-91025    4/2008

OTHER PUBLICATIONS

U.S. Appl. No. 13/358,677, filed Jan. 26, 2012, Kaneko, et al.
U.S. Appl. No. 12/885,815, filed Sep. 20, 2010, Takahiko Sasaki.
U.S. Appl. No. 12/884,965, filed Sep. 17, 2010, Koji Hosono, et al.

* cited by examiner

*Primary Examiner* — Vu Le
*Assistant Examiner* — Han Yang
(74) *Attorney, Agent, or Firm* — Oblon, Spivak, McClelland, Maier & Neustadt, L.L.P.

(57) ABSTRACT

A control circuit applies a first voltage to selected one of first lines and applies a second voltage having a voltage value smaller than that of the first voltage to selected one of second lines, such that a certain potential difference is applied across a memory cell disposed at an intersection of the selected one of the first lines and the selected one of the second lines. A current limiting circuit sets a compliance current defining an upper limit of a cell current flowing in the memory cell, and controls such that the cell current flowing in the memory cell does not exceed the compliance current. The current limiting circuit comprises a current generating circuit and a first current mirror circuit. The current generating circuit generates a first current having a current value equal to a current value of the cell current at a certain timing multiplied by a certain constant. The first current mirror circuit mirrors the first current to a current path supplying the first voltage to the first lines.

20 Claims, 14 Drawing Sheets

SEMICONDUCTOR MEMORY DEVICE

CROSS-REFERENCE TO RELATED APPLICATIONS

This application is based upon and claims the benefit of priority from the prior Japanese Patent Applications No. 2010-40408, filed on Feb. 25, 2010, and No. 2010-68101, filed on Mar. 24, 2010, the entire contents of which are incorporated herein by reference.

FIELD

Embodiments in the specification relate to a semiconductor memory device.

BACKGROUND

In recent years, resistance varying memory devices employing a variable resistor as a memory element are attracting attention as candidates to succeed flash memory. The resistance varying memory devices are assumed here to include not only the narrowly-defined resistance varying memory (ReRAM: Resistive RAM), but also the likes of phase change memory (PCRAM: Phase Change RAM). In ReRAM, a transition metal oxide is used as a recording layer to store a resistance state of the transition metal oxide in a non-volatile manner. In PCRAM, chalcogenide or the like is used as a recording layer to utilize resistance information of a crystalline state (conductor) and an amorphous state (insulator).

There are known to be two kinds of operation modes in memory cells of a resistance varying memory device. In one, referred to as bipolar type, the polarity of applied voltage is switched to set a high-resistance state and a low-resistance state. In the other, referred to as unipolar type, the voltage value and voltage application time are controlled, thus allowing the high-resistance state and the low-resistance state to be set without switching the polarity of applied voltage.

This is explained as follows taking the case of unipolar type ReRAM as an example. Write of data to the memory cell is performed by applying a certain voltage to the variable resistor for a short time. This causes the variable resistor to change from the high-resistance state to the low-resistance state. This operation to change the variable resistor from the high-resistance state to the low-resistance state is hereinafter referred to as a setting operation. On the other hand, erase of data in the memory cell is performed by applying a certain voltage to the variable resistor for a long time, the certain voltage being lower than that applied during the setting operation, and the variable resistor being in the low-resistance state subsequent to the setting operation. This causes the variable resistor to change from the low-resistance state to the high-resistance state. This operation to change the variable resistor from the low-resistance state to the high-resistance state is hereinafter referred to as a resetting operation. The memory cell adopts, for example, the high-resistance state as a stable state (reset state), and, in the case of binary data storage, write of data is performed by the setting operation in which the reset state is changed to the low-resistance state.

Now, there is a possibility of an excessive current flowing in the memory cell immediately after the memory cell has been changed to the low-resistance state. There is a risk that such an excessive current causes, for example, a mistaken resetting operation where the memory cell on which the setting operation has once been completed returns to the reset state, or destruction of the memory cell. Accordingly, a value of the current flowing in the memory cell must be provided with an upper limit (compliance current).

However, in memory cells employing a variable resistor, it is difficult to uniformize characteristics of the variable resistors. Hence the resistance value of the variable resistors before and after completion of the setting operation varies according to the memory cells. Consequently, it is not possible to perform the setting operation properly while preventing mistaken resetting operations and destruction of memory cells simply by setting an identical compliance current for all memory cells. Thus, a technique for appropriately setting the upper limit of the current value on a memory cell-by-memory cell basis is desired.

In addition, the variable resistor in a resistance varying memory immediately after manufacture has an extremely high resistance value and is in a state where its resistance value cannot be easily changed. Accordingly, a forming operation for applying a high voltage to the variable resistor is executed. This results in the resistance value of the variable resistor being capable of transition between the high-resistance state and the low-resistance state, thereby rendering the variable resistor operable as a memory cell.

However, there is a problem, in conventional resistance varying memory, that variation of resistance value among the plurality of variable resistors after the forming operation is large. And, if this variation is large, various subsequent operations such as write (setting) become difficult.

DETAILED DESCRIPTION

A semiconductor memory device in accordance with an embodiment comprises a memory cell array, a control circuit, and a current limiting circuit. The memory cell array has memory cells disposed at intersections of a plurality of first lines and a plurality of second lines, each of the memory cells being including a rectifier and a variable resistor connected in series. The control circuit applies a first voltage to selected one of the first lines and applies a second voltage having a voltage value smaller than that of the first voltage to selected one of the second lines, such that a certain potential difference is applied across the memory cell disposed at the intersection of the selected one of the first lines and the selected one of the second lines. The current limiting circuit sets a compliance current defining an upper limit of a cell current flowing in the memory cell, and controls such that the cell current flowing in the memory cell does not exceed the compliance current. The current limiting circuit comprises a current generating circuit and a first current mirror circuit. The current generating circuit generates a first current having a current value equal to a current value of the cell current at a certain timing multiplied by a certain constant. The first current mirror circuit mirrors the first current to a current path supplying the first voltage to the first lines.

A semiconductor memory device in accordance with another embodiment comprises a memory cell array and a control circuit. The memory cell array has memory cells disposed at intersections of a plurality of first lines and a plurality of second lines, each of the memory cells including a variable resistor. The control circuit applies a certain voltage to selected one of the first lines and to selected one of the second lines, and thereby applies a voltage to the memory cell disposed at the intersection of the selected one of the first lines and the selected one of the second lines. In a forming operation for rendering the memory cell in a state where transition is possible between a high-resistance state and a low-resistance state, the control circuit repeatedly executes a first processing and a second processing based on a first cell current flowing in the memory cell when a first voltage is applied to the memory cell. The first processing is an operation of raising the first voltage by a certain amount if the first cell current is judged not to have reached a limiting current. The second processing is an operation of raising the limiting current and lower the first voltage to an initial value if the first cell current is judged to have reached the limiting current.

A semiconductor memory device in accordance with an embodiment of the present invention is now described with reference to the drawings.

[First Embodiment]
[Configuration]

Figure 1:
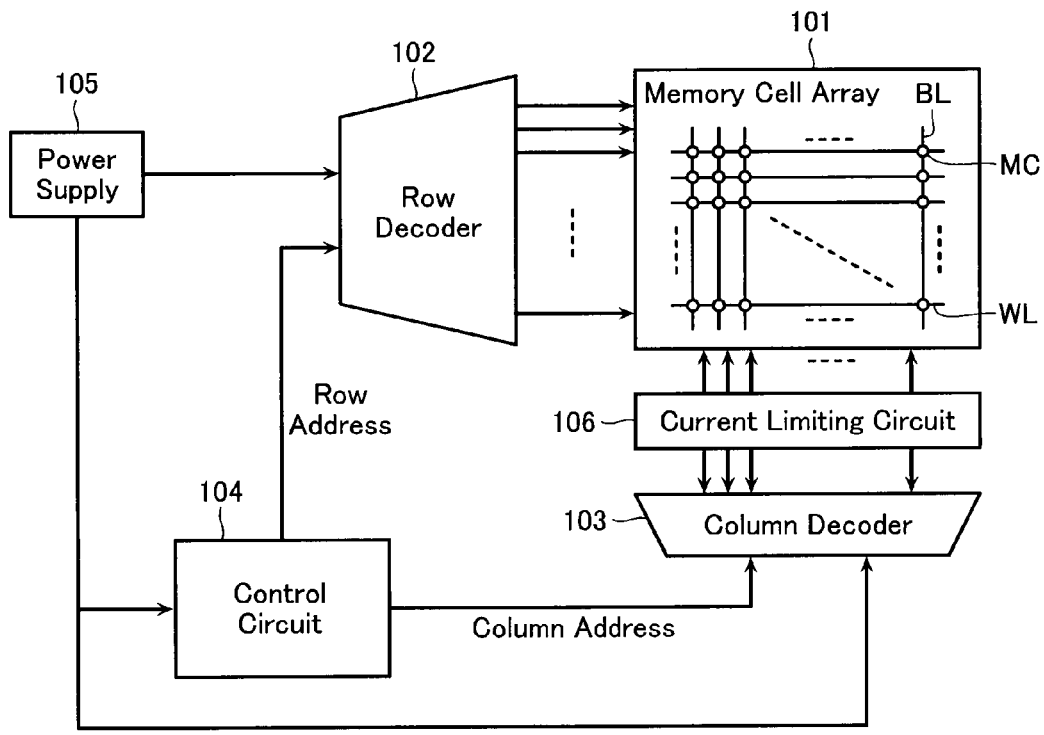
FIG. 1 is a block diagram of a semiconductor memory device in accordance with a first embodiment.

FIG. 1 is a block diagram of a semiconductor memory device in accordance with a first embodiment. This semiconductor memory device includes: a memory cell array 101 configured to store data; a row decoder 102; a column decoder 103; a control circuit 104; a power supply 105; and a current limiting circuit 106. The row decoder 102 to the current limiting circuit 106 are configured to control the memory cell array 101.

The memory cell array 101 includes a plurality of word lines WL, a plurality of bit lines BL intersecting these word lines WL, and memory cells MC disposed at each of intersections of the word lines WL and bit lines BL. The row decoder 102 selects the word lines WL, and the column decoder 103 selects the bit lines BL. The control circuit 104 sends a row address and a column address to, respectively, the row decoder 102 and the column decoder 103, thereby selecting the memory cell MC in the memory cell array 101 to undergo read/write. The control circuit 104 controls start/finish of operations on the selected memory cell MC based on a state of the selected memory cell MC. The power supply 105 generates combinations of certain voltages corresponding to the respective operations of read, write, and erase, and supplies these voltages to the row decoder 102, column decoder 103, and control circuit 104.

In addition, the current limiting circuit 106 functions to control such that, during a setting operation, when a setting voltage VSET is applied to a memory cell MC via the column decoder 103, a cell current Icell flowing in the memory cell MC during the setting operation does not exceed a certain upper limit (compliance current Icomp).

Figure 2:
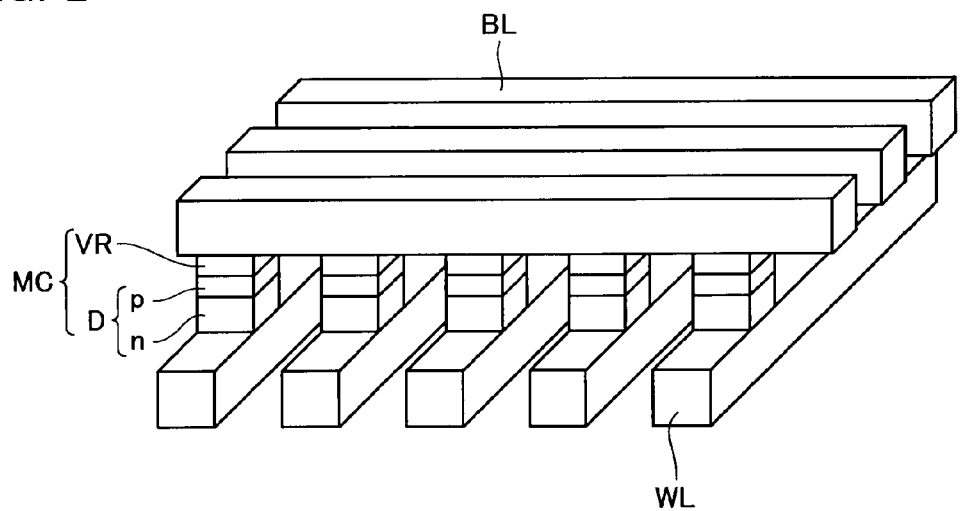
FIG. 2 is a perspective view showing part of a memory cell array 101 in the semiconductor memory device in accordance with the first embodiment.

FIG. 2 is a perspective view showing part of the memory cell array 101 shown in FIG. 1. The memory cell array 101 includes: the plurality of word lines WL disposed in parallel to each other; the plurality of bit lines BL disposed in parallel to each other so as to intersect these word lines WL; and memory cells MC of unipolar type disposed at each of the intersections of the word lines WL and bit lines BL. The memory cell MC includes a variable resistor VR configured to undergo transition between at least two resistance states of a low-resistance state and a high-resistance state, and a rectifier configured from a non-ohmic element, for example, a diode D. Note that the present invention is not limited to unipolar type memory cells MC, and is applicable also to a semiconductor memory device having bipolar type memory cells MC. The semiconductor memory device of the first embodiment shown in FIG. 2 is configured as a so-called cross point type.

In the case of this cross point type configuration, the word lines WL and bit lines BL are configured in a simple line-and-space pattern, and since it is sufficient for the word lines WL and bit lines BL to have an orthogonal positional relationship, there is no need to consider misalignment in the word line WL direction and bit line BL direction. Hence, alignment accuracy in the memory cell array during manufacturing processes can be relaxed, thereby facilitating manufacture.

Utilizable as the variable resistor VR are, for example, PCRAM, CBRAM, and ReRAM, as indicated below. PCRAM varies its resistance value due to phase transition between a crystalline state and an amorphous state, like chalcogenide or the like. CBRAM varies its resistance value by precipitating metal cations to form a contacting bridge between the electrodes and ionizing the precipitated metal to destroy the contacting bridge. ReRAM varies its resistance value by voltage or current application. ReRAM is broadly divided into ones in which resistance variation occurs due to presence/absence of a trapped charge in a charge trap existing at an electrode interface and ones in which resistance variation occurs due to presence/absence of a conductive path induced by oxygen deficiency or the like. Utilizable materials in the case of ReRAM are, for example, $ZnMn_2O_4$, NiO, $TiO_2$, $SrZrO_3$, and $Pr_{0.7}Ca_{0.3}MnO_3$.

In the case of unipolar type ReRAM, write of data to the memory cell MC is performed by applying with the variable resistor VR a setting voltage VSET of, for example, 3.5 V (actually about 4.5 V if a voltage drop portion of the diode D is included), and allowing a current of about 10 nA to flow for a time of about 10 ns-100 ns. This causes the variable resistor VR to change from the high-resistance state to the low-resistance state (setting operation).

On the other hand, erase of data in the memory cell MC is performed by applying with the variable resistor VR in the low-resistance state subsequent to the setting operation a resetting voltage VRESET of 0.8 V (actually about 2.0 V if a voltage drop portion of the diode D is included), and allowing a current of about 1 μA-10 μA to flow for a time of about 500 ns-2 μs. This causes the variable resistor VR to change from the low-resistance state to the high-resistance state (resetting operation).

A read operation of the memory cell MC is performed by applying to the variable resistor VR a read voltage VREAD of 0.4 V (actually about 1.4 V if a voltage drop portion of the diode D is included) and monitoring a current flowing via the variable resistor VR using a sense amplifier. This allows judgment of whether the variable resistor VR is in the low-resistance state or the high-resistance state.

The bit lines BL in the memory cell array 101 shown in FIG. 1 are applied with the voltages (VSET, VRESET, VREAD) corresponding to each of the above-mentioned operations, via the column decoder 103, based on the addresses sent from the control circuit 104.

When executing the setting operation on the memory cell MC, there is variation in the resistance value of the variable resistor VR among the plurality of memory cells MC. Therefore, setting an identical compliance current Icomp for all memory cells MC in a fixed manner leads to difficulties in properly executing the setting operation. These difficulties include, for example, occurrence of a mistaken resetting operation, or the memory cell MC being destroyed and the setting operation conversely becoming unperformable. In order to perform the setting operation properly, a different compliance current Icomp must be set for each of the memory cells MC having a different resistance value.

In the first embodiment, the current limiting circuit 106 generates the compliance current Icomp based on the cell current Icell flowing in the memory cell at a certain timing and performs control such that the cell current Icell does not exceed this compliance current Icomp. Consequently, an individual compliance current Icomp can be set for each memory cell MC.

Figure 3:
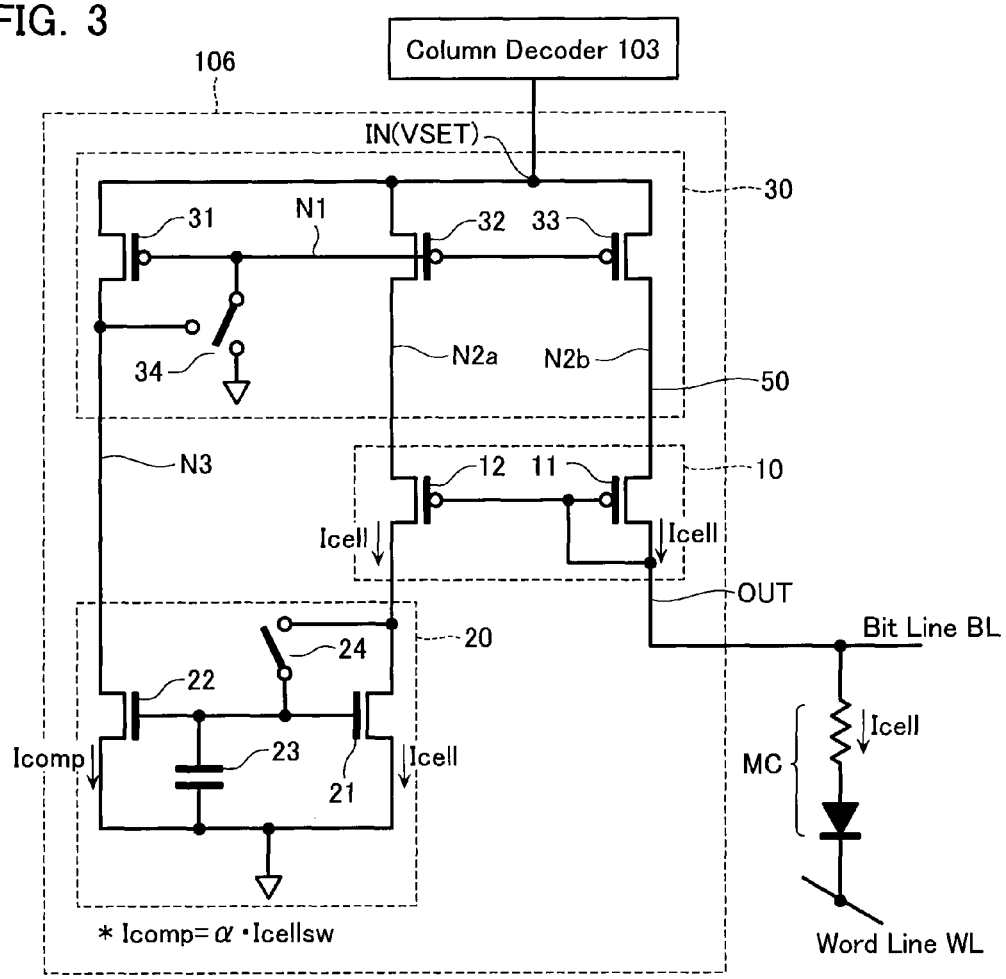
FIG. 3 is a circuit diagram of a control circuit in the semiconductor memory device in accordance with the first embodiment.

FIG. 3 is a circuit diagram of the current limiting circuit 106 in the semiconductor memory device in accordance with the first embodiment. The setting voltage VSET required in the setting operation of the memory cell MC, and so on, are supplied from the column decoder 103 to an input node IN of the current limiting circuit 106. An output node OUT is connected to the bit line BL. The current limiting circuit 106 includes current mirror circuits 10, 20 and 30.

The current mirror circuit 10 includes PMOS transistors 11 and 12. The PMOS transistor 11 is connected so as to form a current path 50 between the input node IN and the output node OUT and is diode-connected. The PMOS transistor 12 shares its gate with the PMOS transistor 11. The PMOS transistors 11 and 12 have an identical size. This causes the cell current Icell flowing in the PMOS transistor 11 to be mirrored in the PMOS transistor 12.

The current mirror circuit 20 is a circuit configured to generate the compliance current Icomp (first current) based on the cell current Icell. Specifically, the current mirror circuit 20 is a circuit configured to generate a compliance current Icomp having a current value being equal to a current value of the cell current Icell at a certain timing multiplied by a certain constant ($\alpha$). The current mirror circuit 20 includes NMOS transistors 21 and 22, a capacitor 23, and a switch 24.

The NMOS transistor 21 has its drain connected to a drain of the PMOS transistor 12 and its source connected to a ground terminal. The NMOS transistor 21 has its gate and drain switchable between a short-circuited state and a disconnected state by a switch 24.

The NMOS transistor 22 has its gate connected to the gate of the NMOS transistor 21 and its source grounded. The NMOS transistor 22 has a size which is a times a size of the NMOS transistor 21. The capacitor 23 has its one end connected to the gates of the NMOS transistors 21 and 22 and its other end connected to the ground terminal.

The current mirror circuit 20 performs a mirror operation while the switch 24 is in a conducting state to cause the current Icomp ($=\alpha \cdot$Icell) to flow in the NMOS transistor 22 based on the current Icell flowing in the NMOS transistor 21. When the switch 24 attains a non-conducting state at a certain timing after the capacitor 23 has been charged, the voltage at both ends applied by the capacitor 23 causes a constant current Icomp to continue to flow in the NMOS transistor 22 thereafter. At this time, if a value of the cell current Icell immediately before the switch 24 switches to the non-conducting state is assumed to be Icellsw, the compliance current Icomp becomes $\alpha \times$Icellsw. Such a fixed compliance current Icomp is mirrored in the current path 50 by the current mirror circuit 30, whereby the above-mentioned current limiting is performed. This fixed compliance current Icomp has a value which is proportional to the cell current Icell in the selected memory cell MC at a certain timing. As a result, current control reflecting the difference in characteristics of each of the memory cells MC is enabled.

The current mirror circuit 30 includes three PMOS transistors 31-33 and a switch 34. The three PMOS transistors 31-33 are configured to become current mirror-connected to each other when the switch 34 is switched to a state where a source and drain of the transistor 31 are short-circuited, thereby rendering the mirror operation executable. The PMOS transistors 31-33 have their sources connected to the input node IN. The PMOS transistors 31-33 have their gates commonly connected to a node N1. The PMOS transistors 32 and 33 have their drains connected respectively to the sources of the PMOS transistors 12 and 11 at nodes N2a and N2b. The PMOS transistor 31 has its drain connected to the drain of the previously-mentioned transistor 22 at node N3. The switch 34 is connected between the gate and the drain of the transistor 31. Rendering the switch 34 conducting causes the mirror operation in the current mirror circuit 30 to be started, whereby flow of the compliance current Icomp in the current path 50 is enabled.

Note that these transistors 31-33 have a size sufficient for them to attain saturation state when a current of about previously-mentioned $\alpha \times$Icellsw flows. In addition, immediately after start of the setting operation, the switch 34 connects the node N1 to the ground terminal. This causes the transistors 32 and 33 to be turned on, whereby the setting voltage VSET supplied from the input terminal IN is rendered capable of being supplied.

Figure 4:
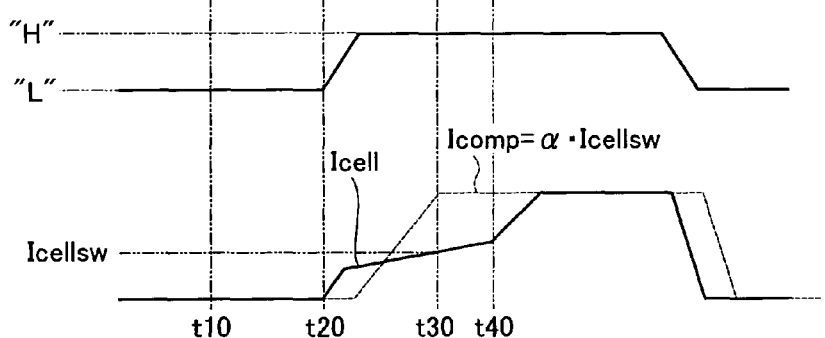
FIG. 4 is an operation waveform chart of the control circuit in the semiconductor memory device in accordance with the first embodiment.

Next, operation in this setting operation of the semiconductor memory device is described with reference to FIG. 4.

At time t10, the selected word line WL changes from "H" (voltage VSET) to "L" (ground voltage VSS). Then, at time t20, when the selected bit line BL switches from "L" to "H", the setting operation due to the setting voltage VSET is started. The cell current Icell begins to flow in the selected memory cell MC. At this time, the switch 24 is short-circuiting the gate and drain of the NMOS transistor 21, while the switch 34 is connecting the node N1 and the ground terminal.

Subsequently, at time t30 after the cell current Icell has stabilized, the switch 24 is set to the non-conducting state to disconnect the gate and drain of the transistor 21, and, in addition, the switch 34 is switched to short-circuit the gate and drain of the transistor 31. At this time t30, the current value of the cell current Icell is assumed to be Icellsw. Hence, a compliance current Icomp having a fixed value α×Icellsw continues to flow in the transistor 22, and a situation results whereby this compliance current Icomp can be mirrored in the current circuit 50 via the current mirror circuit 30. The fact that the compliance current Icomp is mirrored in this way means that, subsequently, after the setting operation has been completed at, for example, time t40, the cell current Icell is limited to the compliance current Icomp (=α×Icellsw) or less.

This compliance current Icomp is set to a large value when a memory cell MC of low resistance and having a large cell current Icell flowing therein is selected, and is set to a small value when a memory cell MC of high resistance and having only a small current flowing therein is selected. Consequently, the first embodiment enables setting of a compliance current Icomp reflecting the difference in characteristics of the memory cells MC, and makes it possible to execute the setting operation properly without causing a mistaken resetting operation, destruction of the memory cell MC, or the like.

[Second Embodiment]

Figure 5:
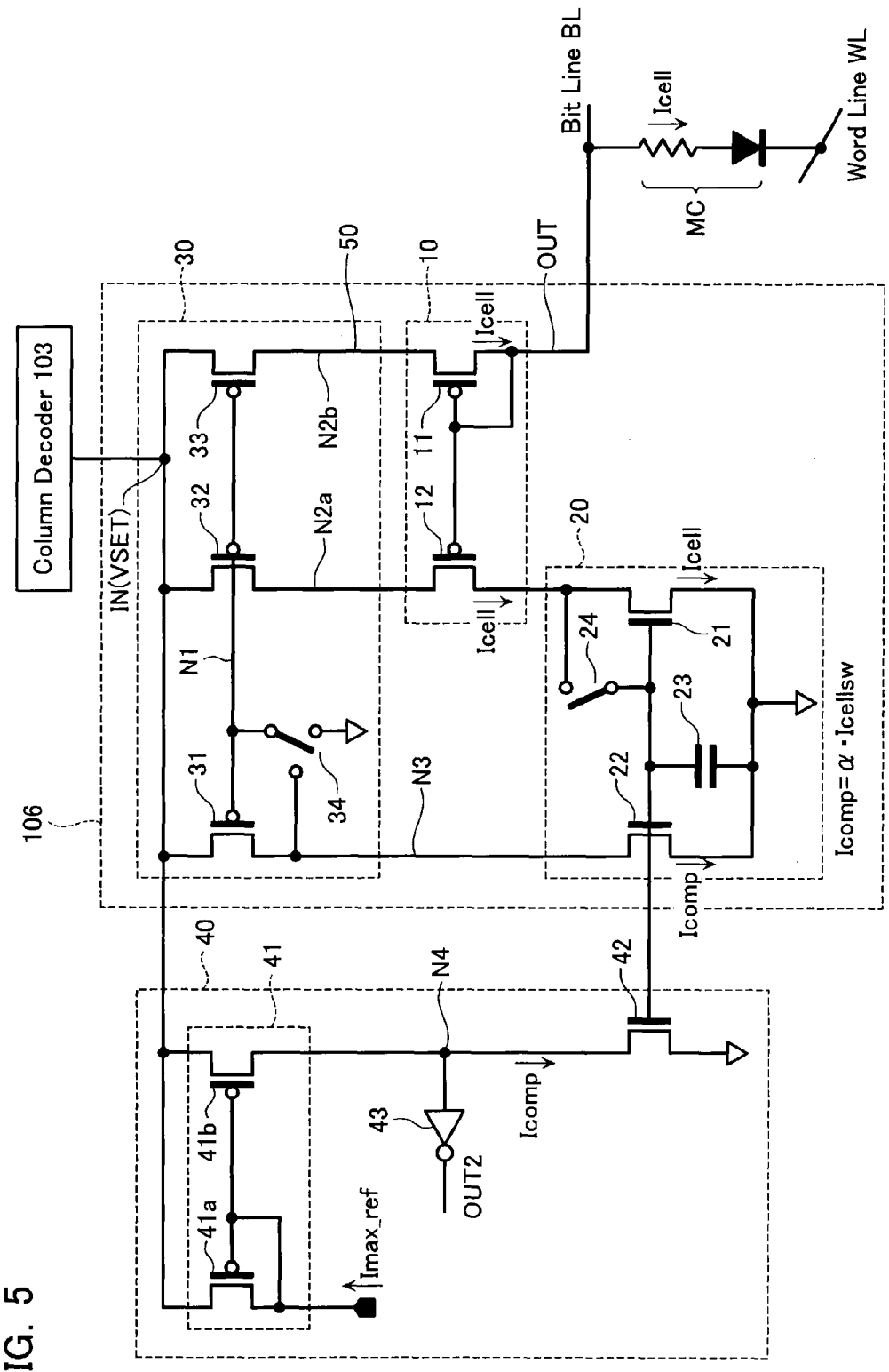
FIG. 5 is a circuit diagram of a control circuit in a semiconductor memory device in accordance with a second embodiment.

Next, a second embodiment is described with reference to FIG. 5. Identical symbols are assigned to configurations identical to those in the first embodiment, and detailed descriptions thereof are hereafter omitted.

The semiconductor memory device of this second embodiment has an overall configuration which is as shown in FIGS. 1 and 2. Moreover, the configuration of the current limiting circuit 106 is also similar. However, this embodiment differs from the first embodiment in comprising a maximum current limiting circuit 40 configured to limit a maximum value of the cell current Icell.

The maximum current limiting circuit 40 includes a current mirror circuit 41, an NMOS transistor 42, and an inverter 43.

The current mirror circuit 41 includes PMOS transistors 41a and 41b. These transistors 41a and 41b have their sources connected to the input node IN and their gates commonly connected. The transistor 41a has its gate and drain short-circuited, and, in addition, has its drain applied with a constant current Imax_ref from a constant current source circuit not shown. The constant current Imax_ref is a current for defining a maximum allowable cell current Icell. The transistor 41b has its drain connected to a drain of the NMOS transistor 42. The NMOS transistor 42 has its source grounded and its gate connected to the gates of the transistors 21 and 22. This causes the compliance current Icomp to flow in the transistor 42. The inverter 43 is connected to the drains of the transistors 41b and 42. The inverter 43 judges a change in potential of a node N4, the node N4 changing based on the difference between the current Imax_ref and the current Icomp, and outputs an output signal OUT2. This output signal OUT2 causes supply of the voltage VSET and so on to be discontinued.

This maximum current limiting circuit 40 enables the maximum value of the cell current Icell to be limited. In the case of only the current limiting circuit 106, there is a risk that, if a memory cell MC allowing flow of an extremely large current exists, a cell current Icell exceeding expectations flows. However, the second embodiment enables the maximum value of the cell current Icell to be limited even in such a case.

[Third Embodiment]

Figure 6:
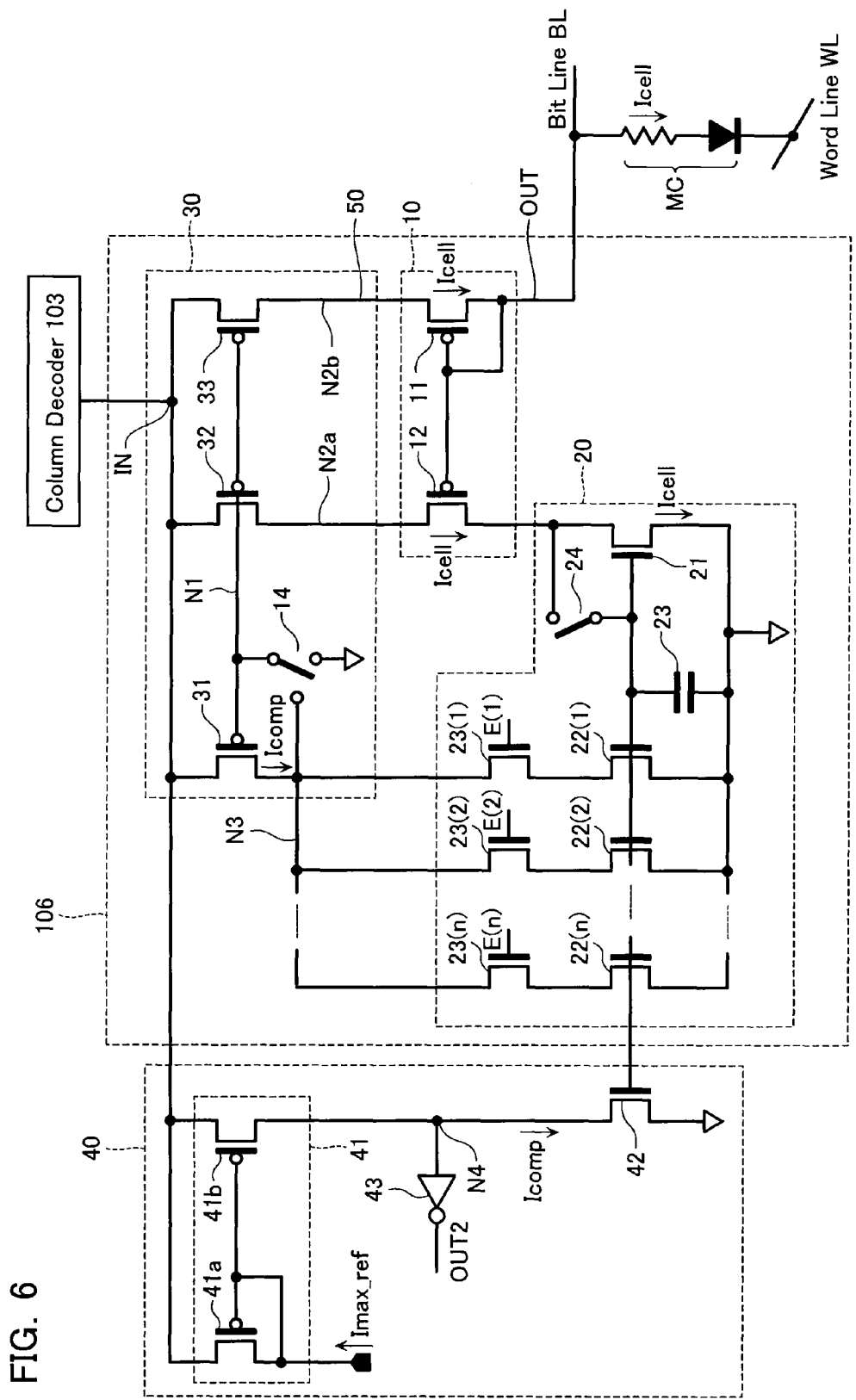
FIG. 6 is a circuit diagram of a control circuit in a semiconductor memory device in accordance with a third embodiment.

Next, a third embodiment is described with reference to FIG. 6. Identical symbols are assigned to configurations identical to those in the aforementioned embodiments, and detailed descriptions thereof are hereafter omitted.

The semiconductor memory device of the third embodiment has an overall configuration which is as shown in FIGS. 1 and 2. Moreover, the configuration of the maximum current limiting circuit 40 is also similar to that in FIG. 5. However, this third embodiment has a configuration of the current limiting circuit 20 which is different to that of the aforementioned embodiments. This embodiment includes, in place of the transistor 22, n NMOS transistors 22(1)-22(n) connected in parallel between the node N3 and the ground terminal. These transistors 22(1)-22(n) have their gates commonly connected to the transistor 21. In addition, these transistors 22(1)-22(n) are connected in series to, respectively, enable NMOS transistors 23(1)-23(n). These enable NMOS transistors 23(1)-23(n) have their gates applied with, respectively, enable signals E(1)-E(n), and can thereby be selectively turned on. Changing the number of NMOS transistors 23(1)-23(n) that are turned on allows the value of above-mentioned a to be adjusted, whereby the upper limit of the cell current Icell in the current limiting circuit 106 can be changed.

[Fourth Embodiment]

[Configuration]

Figure 7:
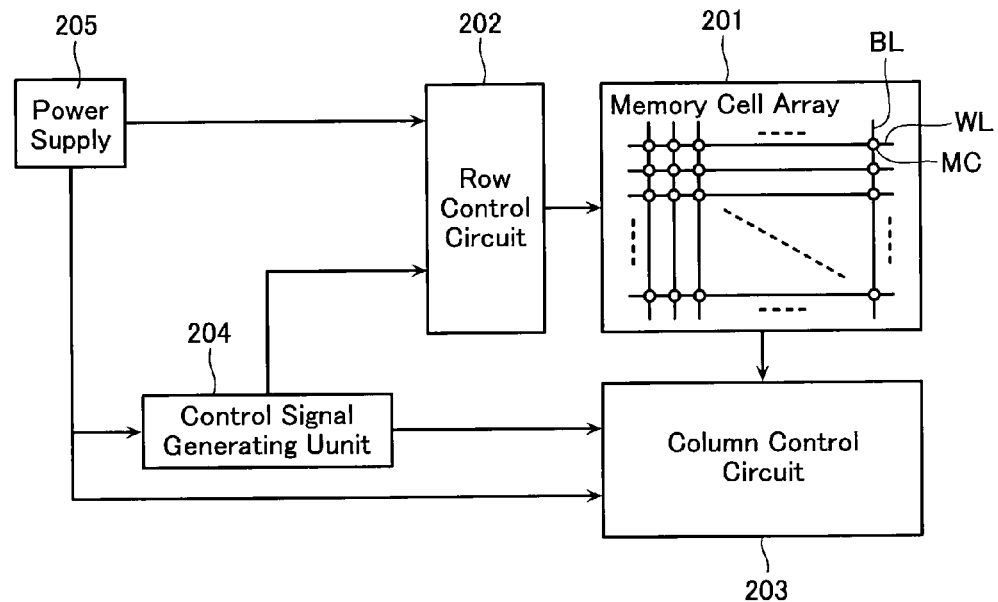
FIG. 7 is a block diagram of a semiconductor memory device in accordance with a fourth embodiment.

FIG. 7 is a block diagram of a semiconductor memory device in accordance with a fourth embodiment. As shown in FIG. 7, the semiconductor memory device in accordance with the fourth embodiment includes a memory cell array 201, a row control circuit 202, a column control circuit 203, a control signal generating unit 204, and a power supply 205.

The memory cell array 201 includes a plurality of word lines WL, a plurality of bit lines BL intersecting these word lines WL, and memory cells MC disposed at each of intersections of the word lines WL and bit lines BL. The row control circuit 202 selects the word lines WL and applies to the word lines WL a voltage required in the various operations. The column control circuit 203 selects the bit lines BL and applies to the bit lines BL a voltage required in the various operations. In addition, the column control circuit 203 includes a sense amplifier circuit configured to detect and amplify a signal appearing in the bit line BL and thereby judge data retained in the memory cell MC.

The control signal generating unit 204 sends a row address and a column address to, respectively, the row control circuit 202 and the column control circuit 203. The power supply 205 supplies a power supply voltage to the row control circuit 202, the column control circuit 203, and the control signal generating unit 204.

Figure 8:
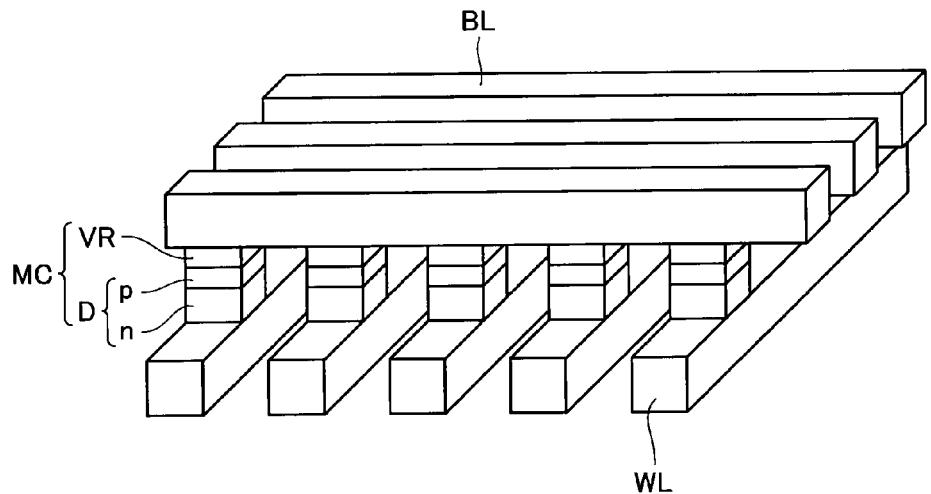
FIG. 8 is a perspective view showing part of a memory cell array 201 in accordance with the fourth embodiment.

FIG. 8 is a perspective view showing part of the memory cell array 201 shown in FIG. 7. The memory cell array 201 includes: the plurality of word lines WL disposed in parallel to each other; the plurality of bit lines BL disposed in parallel to each other so as to intersect these word lines WL; and memory cells MC of unipolar type disposed at each of the intersections of the word lines WL and bit lines BL. The memory cell MC includes a variable resistor VR configured to undergo transition between at least two resistance states of a low-resistance state and a high-resistance state, and a rectifier configured from a non-ohmic element, for example, a diode D. Note that the present invention is not limited to unipolar type memory cells MC, and is applicable also to a semiconductor memory device having bipolar type memory cells MC. The semiconductor memory device of the fourth embodiment shown in FIG. 8 is configured as a so-called cross point type.

In the case of this cross point type configuration, the word lines WL and bit lines BL are configured in a simple line-and-space pattern, and since it is sufficient for the word lines WL and bit lines BL to have an orthogonal positional relationship, there is no need to consider misalignment in the word line WL direction and bit line BL direction. Hence, alignment accuracy in the memory cell array during manufacturing processes can be relaxed, thereby facilitating manufacture.

Utilizable as the variable resistor VR are, for example, PCRAM, CBRAM, and ReRAM, as indicated below. PCRAM varies its resistance value due to phase transition between a crystalline state and an amorphous state, like chalcogenide or the like. CBRAM varies its resistance value by precipitating metal cations to form a contacting bridge between the electrodes and ionizing the precipitated metal to destroy the contacting bridge. ReRAM varies its resistance value by voltage or current application. ReRAM is broadly divided into ones in which resistance variation occurs due to presence/absence of a trapped charge in a charge trap existing at an electrode interface and ones in which resistance variation occurs due to presence/absence of a conductive path induced by oxygen deficiency or the like. Utilizable materials in the case of ReRAM are, for example, $ZnMn_2O_4$, NiO, $TiO_2$, $SrZrO_3$, and $Pr_{0.7}Ca_{0.3}MnO_3$.

Immediately after manufacture, the variable resistor VR is in a state where its resistance value is extremely high and where that resistance value does not easily change. Accordingly, a forming operation is executed on the variable resistor VR to render it functional as a memory cell MC in various operations. In the forming operation, a forming voltage Vform (4 V or more) is applied to the variable resistor VR, thereby a large current is passed through the variable resistor VR. This large current causes a filament path (current path) to be formed within the variable resistor VR. After completion of the forming operation, the filament path within the variable resistor VR is caused to undergo repeated discontinuation and restoration through application of certain voltages to the memory cell MC. This enables the variable resistor VR to undergo transition between the low-resistance state and the high-resistance state.

In the case of unipolar type ReRAM, the setting operation on the memory cell MC (write of data) is performed by applying with the variable resistor VR a setting voltage Vset of, for example, 3.5 V (actually about 4.5 V if a voltage drop portion of the diode D is included) and allowing a current of about 10 nA to flow for a time of about 10 ns-100 ns. This causes the variable resistor VR to change from the high-resistance state to the low-resistance state.

On the other hand, the resetting operation on the memory cell MC (erase of data) is performed by applying with the variable resistor VR in the low-resistance state subsequent to the setting operation a resetting voltage Vreset of 0.8 V (actually about 2.0 V if a voltage drop portion of the diode D is included) and allowing a current of about 1 μA-10 μA to flow for a time of about 500 ns-2 μs. This causes the variable resistor VR to change from the low-resistance state to the high-resistance state.

A read operation on the memory cell MC (read of data) is performed by applying to the variable resistor VR a read voltage Vread of 0.4 V (actually about 1.4 V if a voltage drop portion of the diode D is included) and monitoring a current flowing via the variable resistor VR using a sense amplifier. This allows judgment of whether the variable resistor VR is in the low-resistance state or the high-resistance state.

The bit lines BL in the memory cell array 201 shown in FIG. 7 are applied with the voltages (forming voltage Vform, setting voltage Vset, resetting voltage Vreset, read voltage Vread) corresponding to each of the above-mentioned operations, by the column control circuit 203, based on the column addresses sent from the control signal generating unit 204.

Figure 9:
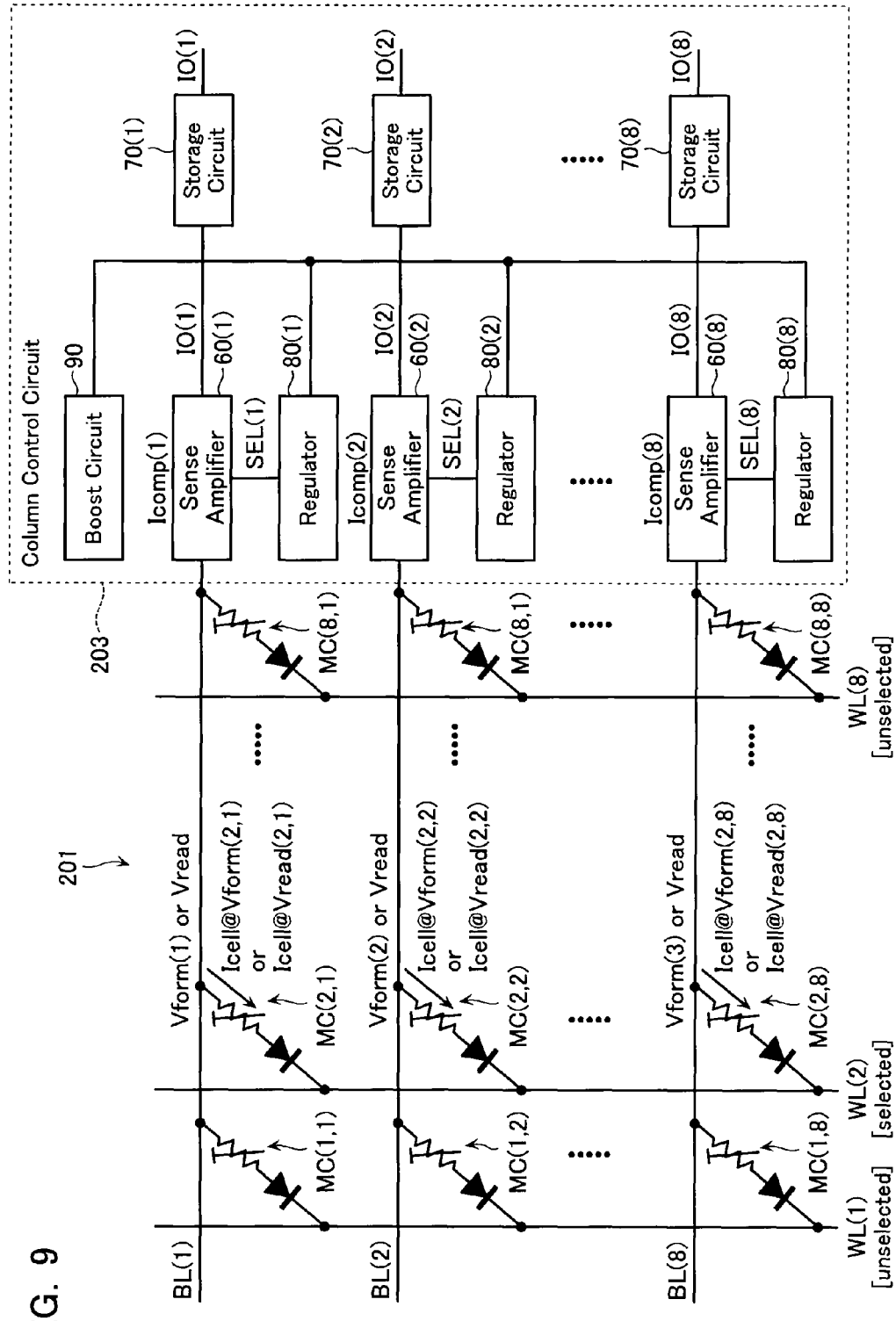
FIG. 9 is a block diagram showing a column control circuit 203 in accordance with the fourth embodiment.

FIG. 9 is a block diagram showing the column control circuit 203 in the semiconductor memory device in accordance with the fourth embodiment. In the example shown in FIG. 9, the memory cell array 201 includes eight word lines WL(1)-(8), eight bit lines BL(1)-(8), and, at intersections of these word lines and bit lines, memory cells MC(1,1)-(8,8). The column control circuit 203 includes, provided to each of the bit lines BL(1)-(8), sense amplifiers 60(1)-(8), storage circuits 70(1)-(8), and regulators 80(1)-(8). In addition, the column control circuit 203 includes a boost circuit 90 utilized commonly on the bit lines BL(1)-(8).

For example, if the word line WL(2) is selected and all the bit lines BL(1)-(8) are selected and applied with the forming voltage Vform, a cell current Icell@Vform(2,1)-(2,8) flows in the selected memory cells MC(2,1)-(2,8). In addition, if the word line WL(2) is selected and all the bit lines BL(1)-(8) are selected and applied with the read voltage Vread, a cell current Icell@Vread(2,1)-(2,8) flows in the selected memory cells MC(2,1)-(2,8).

During the forming operation, the sense amplifiers 60(1)-(8) apply a forming voltage Vform(1)-(8) to the bit lines BL(1)-(8) based on voltages SEL(1)-(8) supplied via the regulators 80(1)-(8). The sense amplifiers 60(1)-(8) set compliance currents (limiting currents) Icomp(1)-(8) which each differ based on signals 10(1)-(8) stored in the storage circuits 70(1)-(8). The sense amplifiers 60(1)-(8) perform respective control such that the cell currents Icell@Vform(2,1)-(2,8) are not more than the compliance currents Icomp(1)-(8). In addition, in the case that the cell currents Icell@Vform(2,1)-(2,8) reach the compliance currents Icomp(1)-(8), the sense amplifiers 60(1)-(8) respectively output to the storage circuits 70(1)-(8) the signals IO(1)-(8) indicating to that effect.

During the forming operation, the regulators 80(1)-(8) can incrementally raise the forming voltages Vform(1)-(8) by incrementally raising the voltages SEL(1)-(8). Moreover, during the read operation, the regulators 80(1)-(8) can set the read voltage Vread by setting the voltages SEL(1)-(8) to a lower constant voltage than during the forming operation. During the forming operation, the boost circuit 90 generates a voltage which is the reference voltage boosted, and supplies that boosted voltage to the regulators 80(1)-(8). Note that, hereinafter, when referring generally to the word lines WL(1)-(8), voltages SEL(1)-(8), regulators 80(1)-(8) and so on, these are sometimes referred to as, for example, word lines WL, voltages SEL, and regulators 80, without adding the numbers (1)-(8).

Figure 10:
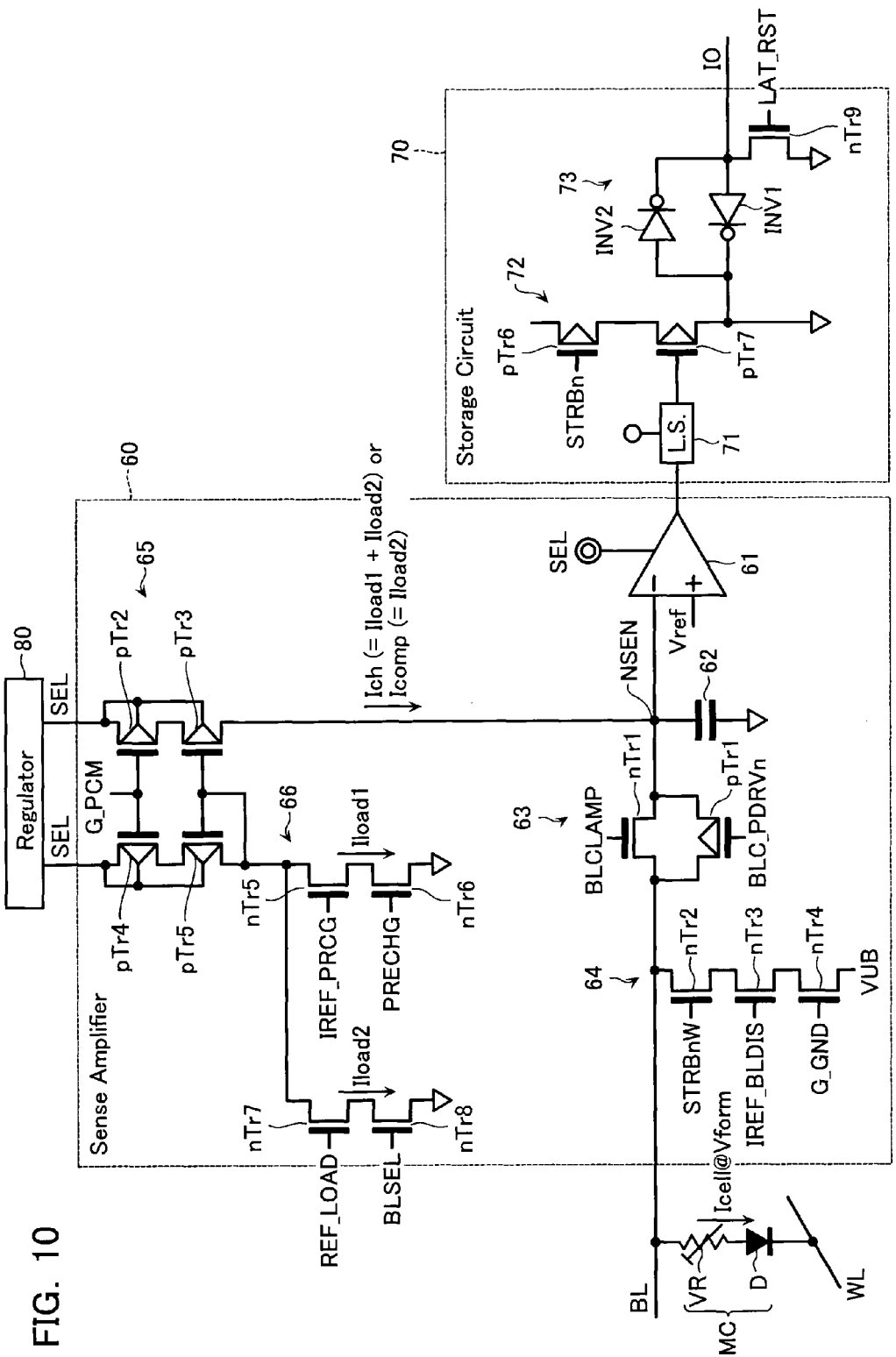
FIG. 10 is a circuit diagram showing a sense amplifier 60 and a storage circuit 70 in accordance with the fourth embodiment.

FIG. 10 is a circuit diagram showing one example of a specific configuration of the sense amplifiers 60 and storage circuits 70. As shown in FIG. 10, the sense amplifier 60 includes a differential amplifier 61, a capacitor 62, a clamp circuit 63, a switch circuit 64, a current mirror circuit 65, and a switch circuit 66.

The differential amplifier 61 has its inverting input terminal connected to a sense node NSEN and its non-inverting input terminal applied with a reference voltage Vref. The differential amplifier 61 has its output terminal connected to the storage circuit 70. The capacitor 62 has its one end connected to the sense node NSEN and its other end grounded.

The clamp circuit 63 has its one end connected to the sense node NSEN and its other end connected to the bit line BL. The clamp circuit 63 includes an NMOS transistor nTr1 and a PMOS transistor pTr1 connected in parallel. The NMOS transistor nTr1 and the PMOS transistor pTr1 are provided between the sense node NSEN and the bit line BL, and have their gates inputted with a signal BLCLAMP and a signal BLC_PDRVn of constant voltage, respectively.

The switch circuit 64 is turned on at a certain timing to set a voltage of the bit line BL to a certain voltage VUB. The voltage VUB is a voltage applied to an unselected bit line BL. The switch circuit 64 includes NMOS transistors nTr2-nTr4 connected in series. The NMOS transistor nTr2 has its drain connected to the bit line BL, and the NMOS transistor nTr4 has its source applied with the voltage VUB. The NMOS transistors nTr2-nTr4 have their gates inputted with a signal STRBnW, a signal IREF_BLDIS, and a signal G_GND, respectively. The signal STRBnW and the signal IREF_BLDIS cause the NMOS transistors pTr2 and nTr3 to be always turned on during the forming operation. On the other hand, the NMOS transistor pTr4 is caused to be turned on by the signal G_GND only when the bit line BL connected to the switch 64 is unselected.

The current mirror circuit 65 mirrors the current flowing in the switch circuit 66 to cause flow of a charging current Ich or the compliance current Icomp. The charging current Ich is passed when charging the bit line BL to a certain value, and is larger than the compliance current Icomp. The compliance current Icomp specifies an upper limit of the cell current Icell@Vform flowing in the memory cell MC.

The current mirror circuit 65 includes PMOS transistors pTr2-pTr5. The PMOS transistors pTr2 and pTr3 are connected in series. The PMOS transistors pTr2 has its source inputted with the voltage SEL, and the PMOS transistor pTr3 has its drain connected to the sense node NSEN. The PMOS transistors pTr2 and pTr3 have their gates connected to gates of the PMOS transistors pTr4 and pTr5, respectively. The PMOS transistors pTr4 and pTr5 are connected in series. The PMOS transistor pTr4 has its source applied with the voltage SEL, and the PMOS transistor pTr5 has its drain and gate connected. In addition, the PMOS transistors pTr2 and pTr4 have their gates inputted with a signal G_PCM. When the bit line BL connected via the clamp circuit 63 to the current mirror circuit 65 is unselected, the PMOS transistors pTr2 and pTr4 are turned off by the signal G_PCM being "H".

The switch circuit 66 performs selection of the charging current Ich and compliance current Icomp, and sets current values for those currents. The switch circuit 66 is turned on at a certain timing to ground the drain of the PMOS transistor pTr5. The switch circuit 66 includes NMOS transistors nTr5-nTr8.

The NMOS transistors nTr5 and nTr6 are connected in series and provided between the drain of the PMOS transistor pTr5 and the ground terminal. The NMOS transistors nTr7 and nTr8 are connected in series and provided between the drain of the PMOS transistor pTr5 and the ground terminal, in parallel with the NMOS transistors nTr5 and nTr6. The NMOS transistor nTr5 has a large size compared to the NMOS transistor nTr7. Moreover, the NMOS transistors nTr5-nTr8 have their gates inputted with a signal IREF_PRCG, a signal PRECHG, a signal REF_LOAD, and a signal BLSEL, respectively.

During charging of the bit line BL, the signal PRECHG and the signal BLSEL cause the NMOS transistors nTr6 and nTr8 to be turned on, whereby currents Iload1 and Iload2 are respectively caused to flow. As a result, during charging of the bit line BL, the current mirror circuit 65 mirrors a current equivalent to the sum of these currents Iload1 and Iload2, thereby causing flow of the charging current Ich (=Iload1+Iload2). On the other hand, during the forming operation, the NMOS transistor nTr6 is turned off by the signal PRECHG being "L", whereas the NMOS transistor nTr8 is turned on by the signal BLSEL being "H". That is, only the NMOS transistor nTr8 passes the current Iload2. As a result, the current mirror circuit 65 mirrors the current Iload2, thereby causing flow of the compliance current Icomp (=Iload2). Moreover, controlling a voltage level of the signal REF_LOAD allows setting of a desired value for the current value of the current Iload2 and compliance current Icomp.

As shown in FIG. 10, the storage circuit 70 includes a level shifter 71, a switch circuit 72, and a latch circuit 73. The level shifter 71 converts a voltage level of the signal inputted from the differential amplifier 61, and inputs that converted signal to the switch circuit 72.

The switch circuit 72 outputs a signal to the latch circuit 73 based on an output signal from the level shifter 71. The switch circuit 72 includes PMOS transistors pTr6 and pTr7 connected in series. The PMOS transistor pTr6 has its source applied with a certain voltage and its gate inputted with a signal STRBn. The PMOS transistor pTr7 has its gate inputted with a signal from the level shifter 71 and its drain grounded. When a detection signal is downloaded from the sense amplifier 60, the signal STRBn attains "H", whereby the PMOS transistor pTr6 is turned on and the switch circuit 72 is rendered in an operable state.

The latch circuit 73 latches the output signal from the switch circuit 72. The latch circuit 73 includes inverters INV1 and INV2, and an NMOS transistor nTr9. The inverter INV1 has its input terminal connected to an output terminal of the inverter INV2 and has its output terminal connected to an input terminal of the inverter INV2. In addition, the inverter INV1 has its output terminal (input terminal of the inverter INV2) connected to the drain of the PMOS transistor pTr7. Moreover, the inverter INV2 has its output terminal (input terminal of the inverter INV1) connected to a drain of the NMOS transistor nTr9, and outputs a signal IO to external. The NMOS transistor nTr9 has its gate inputted with a signal LAT_RST. When resetting data in the latch circuit 73, the signal LAT_RST is set to "H", whereby the NMOS transistor nTr9 is turned on.

Figure 11:
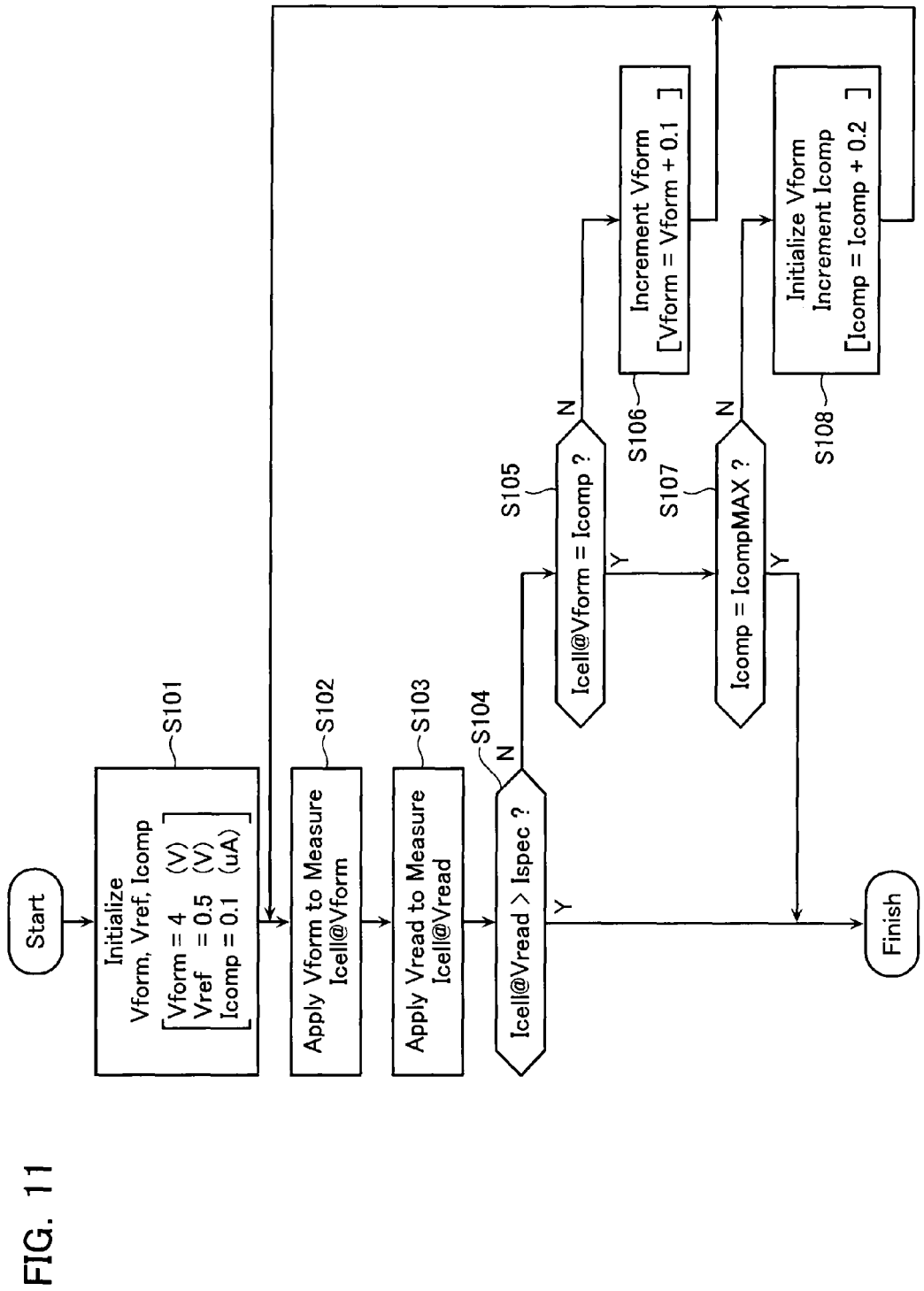
FIG. 11 is a flowchart showing a forming operation by the column control circuit 203 in accordance with the fourth embodiment.

Next, the forming operation, which is the feature of the fourth embodiment, is described with reference to FIG. 11. As shown in FIG. 11, first, the column control circuit 203 sets to initial values the forming voltage Vform, the reference voltage Vref, and the compliance current Icomp (step S101). For example, in step S101, the forming voltage Vform is set to 4 V, the reference voltage Vref is set to 0.5 V, and the compliance current Icomp is set to 0.1 μA.

Next, the column control circuit 203 repeatedly executes a processing of steps S102-S108 based on the cell currents Icell@Vread and Icell@Vform. In steps S105 and S106, if the cell current Icell@Vform is judged not to have reached the compliance current Icomp, the column control circuit 203 raises the forming voltage Vform a certain step-up value (here, 0.1 V).

On the other hand, in steps S105-S108, if the cell current Icell@Vform is judged to have reached the compliance current Icomp, the column control circuit 203 raises the compliance current Icomp a certain step-up value (here, 0.2 μA) and lowers the forming voltage Vform to an initial value (4 V).

In the processing of steps S101-S108, different compliance currents Icomp(1)-(8) are set for the bit lines BL(1)-(8). That is, when it is judged that the cell currents Icell@Vform(2,1)-(2,8) flowing from the respective bit lines BL(1)-(8) have reached their respective compliance currents Icomp(1)-(8), the current value of each of the compliance currents Icomp (1)-(8) is raised by an amount of the certain step-up value. Next, the processing of steps S102-S108 is described specifically.

The column control circuit 203 applies the forming voltage Vform to the memory cell MC to measure the cell current Icell@Vform (step S102). Subsequently, the column control circuit 203 applies the read voltage Vread to the memory cell MC to measure a current value of the cell current Icell@Vread (step S103).

Next, the column control circuit 203 judges whether or not the current value of the cell current Icell@Vread is larger than a current value Ispec (Icell@Vread>Ispec) (step S104). Now, if the cell current Icell@Vread is judged to be larger than the current value Ispec (step S104, Y), the column control circuit 203 terminates the forming operation. On the other hand, if the cell current Icell@Vread is judged to be under the current value Ispec (step S104, N), the column control circuit 203 proceeds to execute step S105.

In step S105, the column control circuit 203 judges whether or not the cell current Icell@Vform has reached the compliance current Icomp (Icell@Vform=Icomp). Now, if the cell current Icell@Vform is judged not to have reached the compliance current Icomp (step S105, N), the column control circuit 203 raises the forming voltage Vform (step S106), and executes the processing from step S102 again. For example, in step S106, the forming voltage Vform has its voltage value raised by an amount of a step-up value 0.1 V.

On the other hand, if the cell current Icell@Vform is judged to have reached the compliance current Icomp (step S105, Y), the column control circuit 203 judges whether or not the compliance current Icomp has reached a maximum value IcompMAX (Icomp=IcompMAX) (step S107). Now, if the compliance current Icomp is judged to have reached the maximum value IcompMAX (step S107, Y), the column control circuit 203 terminates the forming operation.

On the other hand, if the compliance current Icomp is judged not to have reached the maximum value IcompMAX (step S107, N), the column control circuit 203 raises the compliance current Icomp and sets the forming voltage Vform to initial conditions (step S108). For example, in step S108, the compliance current Icomp has its current value raised by an amount of a step-up value 0.2 μA. Subsequent to step S108, the column control circuit 203 executes the processing from step S102.

Figure 12:
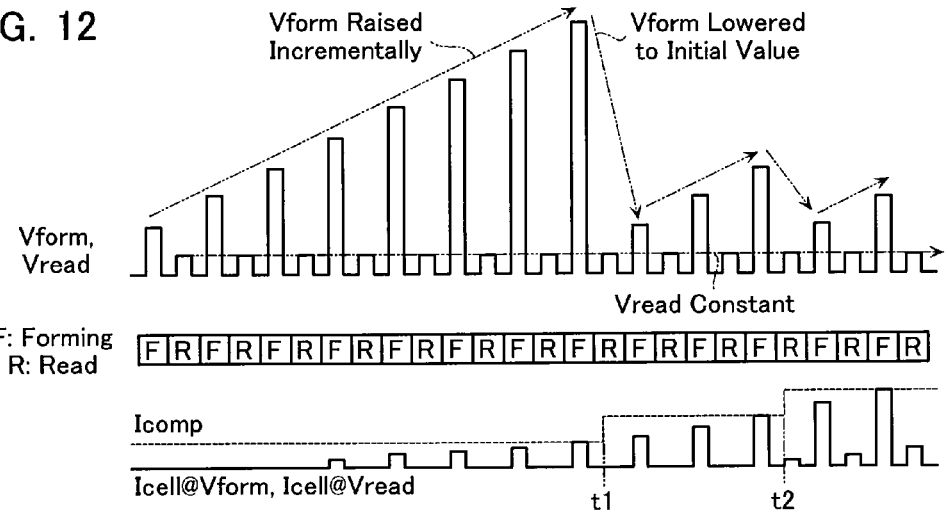
FIG. 12 is a timing chart showing the forming operation in the fourth embodiment.

Next, the forming voltage Vform, read voltage Vread, and compliance current Icomp set by the operations shown in FIG. 11 are described with reference to FIG. 12. FIG. 12 is a timing chart showing the forming operation in accordance with the fourth embodiment. As shown in FIG. 12, the forming voltage Vform and the read voltage Vread are applied alternately to the memory cell MC, thereby an application operation F for the forming voltage Vform and an application operation R for the read voltage Vread are executed alternately. During the forming voltage application operation F, the forming voltage Vform is raised incrementally in pulse form until the cell current Icell@Vform flowing in the memory cell MC reaches the compliance current Icomp, and that increased forming voltage Vform is applied to the memory cell MC in the next operation F. Then, at each of times t1 and t2 when the cell current Icell@Vform has reached the compliance current Icomp, the forming voltage Vform is lowered to an initial value, and this forming voltage Vform lowered to the initial value is applied to the memory cell MC in the next forming voltage application operation F. In addition, at each of times t1 and t2, the compliance current Icomp has its current value raised by an amount of a certain step-up value.

Next, a timing chart in a single forming voltage application operation F of FIG. 12 is explained with reference to FIG. 13. Here, a word line WL and a bit line BL connected to a selected memory cell MC are referred to as selected word line s-WL and selected bit line s-BL, an unselected word line WL is referred to as unselected word line ns-WL, and an unselected bit line BL is referred to as unselected bit line ns-BL. In addition, a selected bit line s-BL and a sense node NSEN connected to an easy-to-undergo-forming memory cell MC are expressed as, respectively, selected bit line s-BL (fast) and sense node NSEN (fast). On the other hand, a selected bit line s-BL and a sense node NSEN connected to a difficult-to-undergo-forming memory cell MC are expressed as, respectively, selected bit line s-BL(slow) and sense node NSEN (slow).

Figure 13:
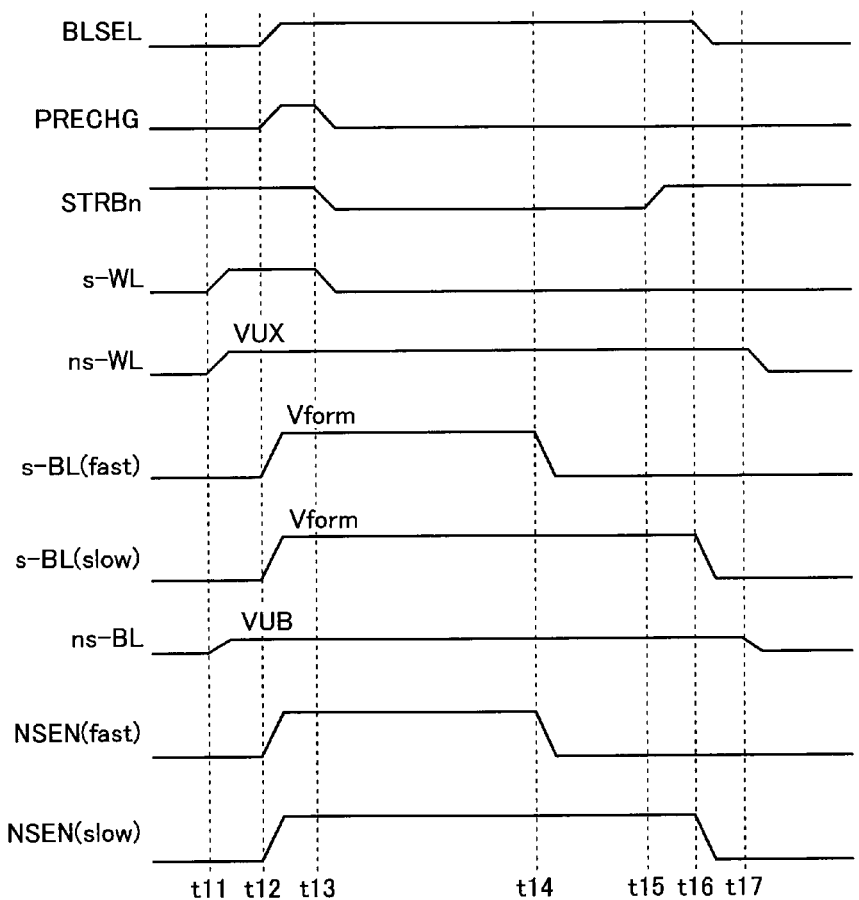
FIG. 13 is a timing chart in accordance with the fourth embodiment.

As shown in FIG. 13, first, at time t11, the voltage of the selected word line s-WL is raised from a "Low state" to a "High state", and the voltage of the unselected word line ns-WL is raised to a voltage VUW. Additionally at time t11, the voltage of the unselected bit line ns-BL is raised to a voltage VUB. Now, a potential difference from the word line WL to the bit line BL is generated, but its direction is a reverse bias direction of the diode D, hence a current does not flow from the word line WL to the bit line BL.

Next, at time t12, the signal BLSEL and the signal PRECHG are raised from the "Low state" to the "High state". As a result, the NMOS transistors nTr6 and nTr8 (refer to FIG. 10) are turned from off to on, the current mirror circuit 65 allows flow of the charging current Ich, and the selected bit line s-BL is rapidly charged. That is, nodes NSEN(fast) and NSEN(slow) are raised from the "Low state" to the "High state", and the voltage of the selected bit line s-BL is raised to the forming voltage Vform.

Subsequently, the signal PRECHG is lowered from the "High state" to the "Low state". As a result, the NMOS transistor nTr6 is turned back off, the current mirror circuit 65 allows flow of the compliance current Icomp, thereby the upper limit of the cell current Icell@Vform is specified. Additionally at time t13, the voltage of the selected word line s-WL is lowered to the "Low state". As a result, a potential difference is generated in a forward bias direction of the diode D from the selected bit line s-BL to the selected word line s-WL, whereby the forming voltage Vform is applied to the selected memory cell MC.

Further at time t13, the signal STRBn is lowered from the "High state" to the "Low state". As a result, the PMOS transistor pTr6 (refer to FIG. 10) is turned on, and the storage circuit 70 begins downloading of the detection signal detected by the sense amplifier 60.

The above-described forming voltage Vform applied at time t13 results in a minute cell current Icell@Vform flowing in the memory cell MC connected to the selected bit line s-BL(fast) and sense node NSEN(fast). Then, at time t14, if the cell current Icell@Vform attains the same level as the compliance current Icomp, the voltages of the sense node NSEN(fast) and the selected bit line s-BL(fast) fall. This causes application of the forming voltage Vform to the memory cell MC to be stopped.

Meanwhile, at time t15, after a certain time has passed from time t13 (start of the forming operation), the signal STRBn is switched back to the "High state". As a result, the PMOS transistor pTr6 (refer to FIG. 10) is turned off, and the storage circuit 70 stops downloading of the detection signal from the sense amplifier 60.

Subsequently, at time t16, the signal BLSEL returns to the "Low state". As a result, the NMOS transistor nTr8 (refer to FIG. 10) is turned off, and the current mirror circuit 131 stops supply of the compliance current Icomp. Additionally at time t16, the regulator 80 stops supply of the voltage SEL. This causes the select bit line s-BL(slow) and the sense node NSEN(slow) to be lowered to the "Low state".

Subsequently, at time t17, the unselected word line ns-WL and the unselected bit line ns-BL are lowered to the ground voltage. That concludes the single forming voltage application operation F of FIG. 12.

[Advantages]

Figure 14:
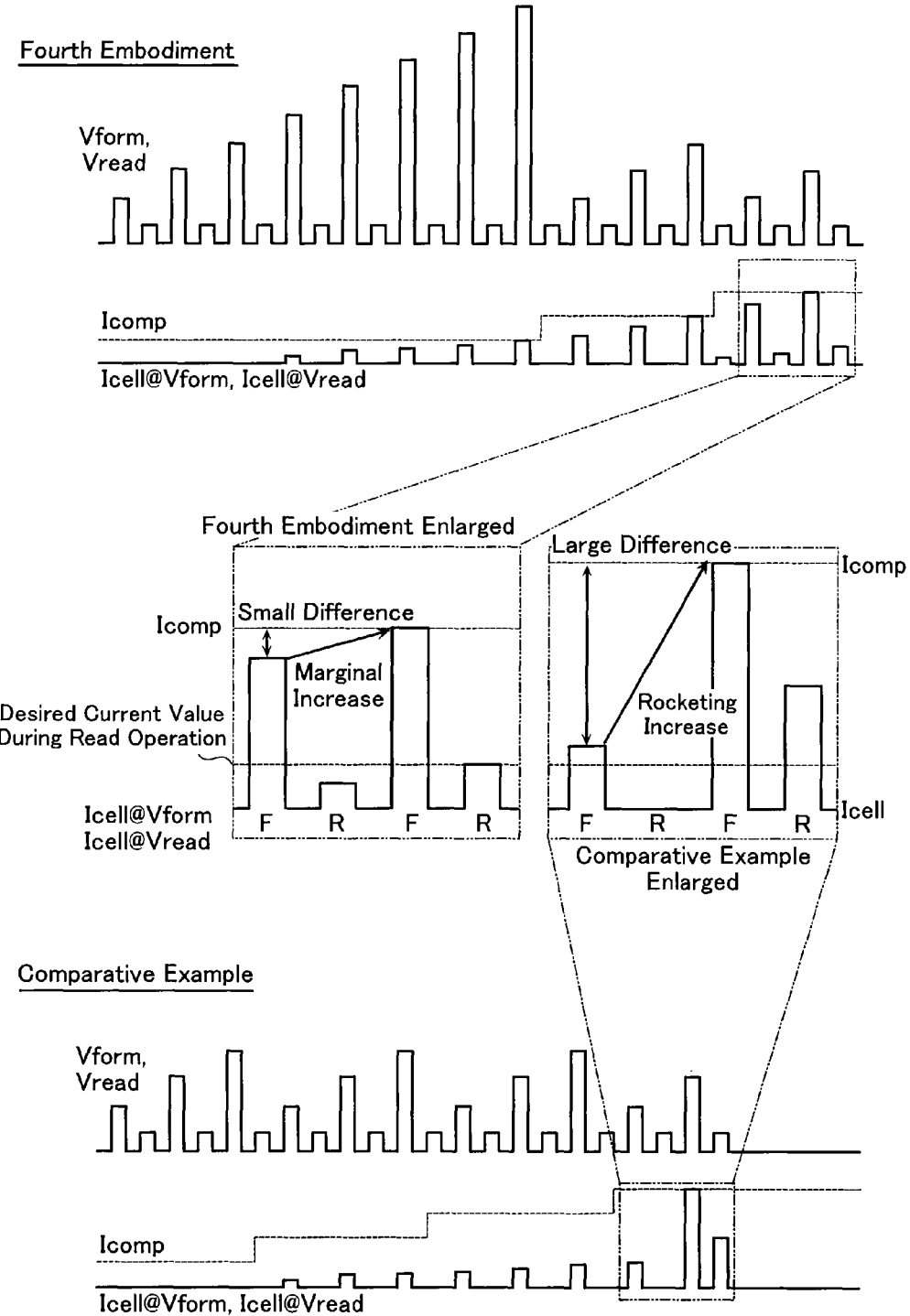
FIG. 14 is a view showing advantages due to the forming operation in the fourth embodiment.

Next, advantages of the semiconductor memory device in accordance with the fourth embodiment are described with reference to FIG. 14. FIG. 14 is a view showing advantages due to the forming operation of the fourth embodiment. In a comparative example herein, a forming voltage application operation is executed multiple times by raising the compliance current Icomp at a previously-determined constant timing (for example, at each of n step-ups of the forming voltage Vform). That is, the forming voltage application operation is executed not by raising the compliance current Icomp at a timing based on the rise in the cell current Icell@Vform as in the fourth embodiment.

An operation sequence in the comparative example creates many memory cells MC that allow flow of a cell current (Icell@Vform, Icell@Vread) having a large current value. Accordingly, the problem arises that, since complete insulation breakdown occurs in the variable resistor VR in a memory cell MC that allows flow of a cell current Icell having a large current value, such a memory cell MC does not perform a switching operation.

In contrast, in the fourth embodiment, the current value of the compliance current Icomp is stepped up only in the case that the cell current Icell@Vform flowing in the memory cell MC during application of the forming voltage Vform becomes equal to a once set compliance current Icomp. That is, the compliance current Icomp can increase only by the cell current Icell@Vform reaching the compliance current Icomp. Hence, dramatic increase in the cell current Icell@Vform during application of the forming voltage Vform can be suppressed, thereby enabling proper execution of the forming operation.

That is, in the fourth embodiment, the compliance current Icomp is raised in accordance with the state of a memory cell MC, hence the cell current Icell flowing in that memory cell MC can be increased little by little. As a result, in the fourth embodiment, the cell current can be set to a targeted value, and the cell current Icell of almost all of the memory cells MC can be held in a current range favorable for switching. Hence, the fourth embodiment enables improvement in yield of memory cells MC capable of withstanding switching a certain number of times.

Figure 15:
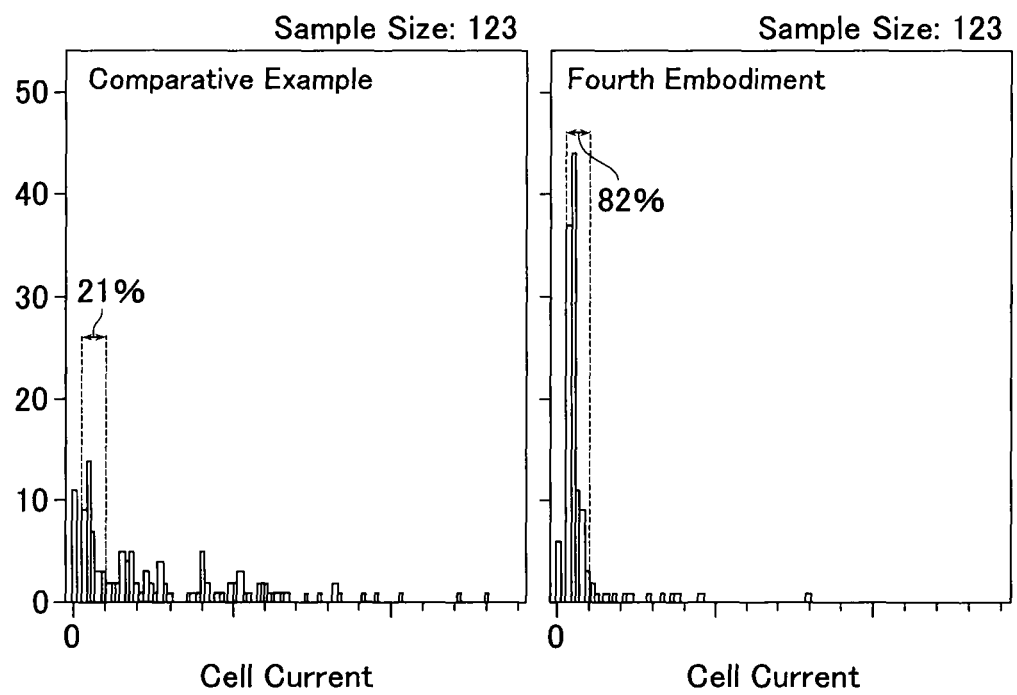
FIG. 15 is a view showing distribution of cell current flowing in each of memory cells MC (sample size: 123) when the memory cells MC are applied with a certain voltage (1.9 V) subsequent to the forming operation, in a comparative example and the fourth embodiment.

FIG. 15 shows distribution of cell currents flowing in each of memory cells MC (sample size: 123) on application of a certain voltage, subsequent to the forming operation, for the comparative example and the fourth embodiment. In the comparative example, 21 percent of the total of memory cells allow flow of a cell current Icell in a certain range. By contrast, in the fourth embodiment, 82 percent of the total of memory cells MC allow flow of the cell current Icell in the certain range. That is, variation in the resistance value among a plurality of variable resistors VR in the fourth embodiment is less than that in the comparative example. This allows the memory cells MC in the fourth embodiment to execute the various operations such as read more easily than those in the comparative example.

[Fifth Embodiment]

[Configuration]

Figure 16:
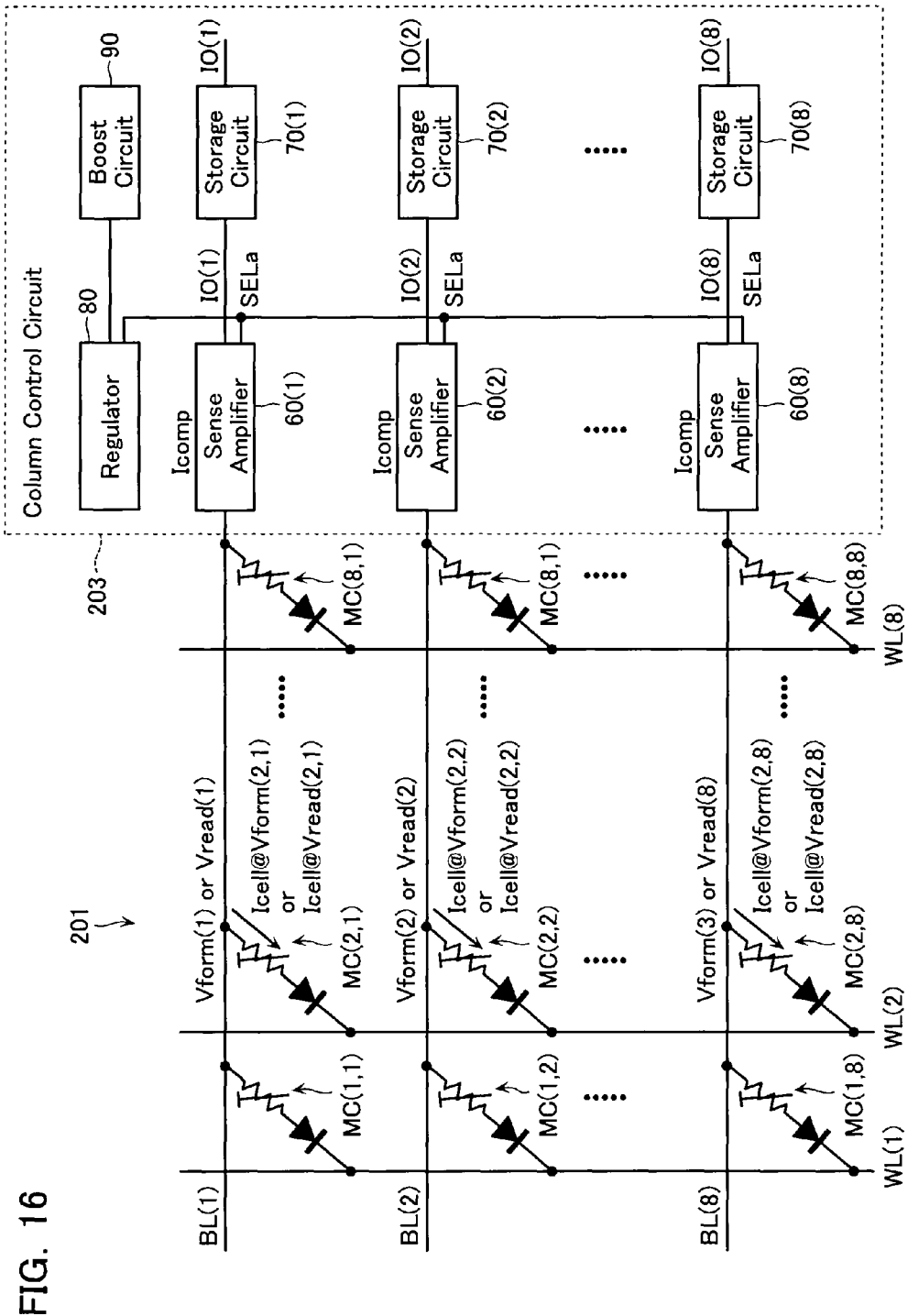
FIG. 16 is a block diagram showing a column control circuit 203 in accordance with a fifth embodiment.

Next, a configuration of a semiconductor memory device in accordance with a fifth embodiment is described with reference to FIG. 16. Note that in the fifth embodiment, identical symbols are assigned to configurations identical to those in the fourth embodiment, and detailed descriptions thereof are hereafter omitted.

As shown in FIG. 9, the previously described fourth embodiment sets the compliance currents Icomp(1)-(8) independently for each of the bit lines BL(1)-(8). As a result, in the fourth embodiment, the regulators 80(1)-(8) are provided to each of the sense amplifiers 60(1)-(8), and input the voltages SEL(1)-(8) to each of these sense amplifiers 60(1)-(8). In contrast, the fifth embodiment sets a common compliance current Icomp between the bit lines BL(1)-(8). As a result, as shown in FIG. 16, the fifth embodiment has one regulator 80 provided commonly to the plurality of sense amplifiers 60(1)-(8), this one regulator 80 providing a common voltage SELa to the sense amplifiers 60(1)-(8).

[Operation]

Figure 17:
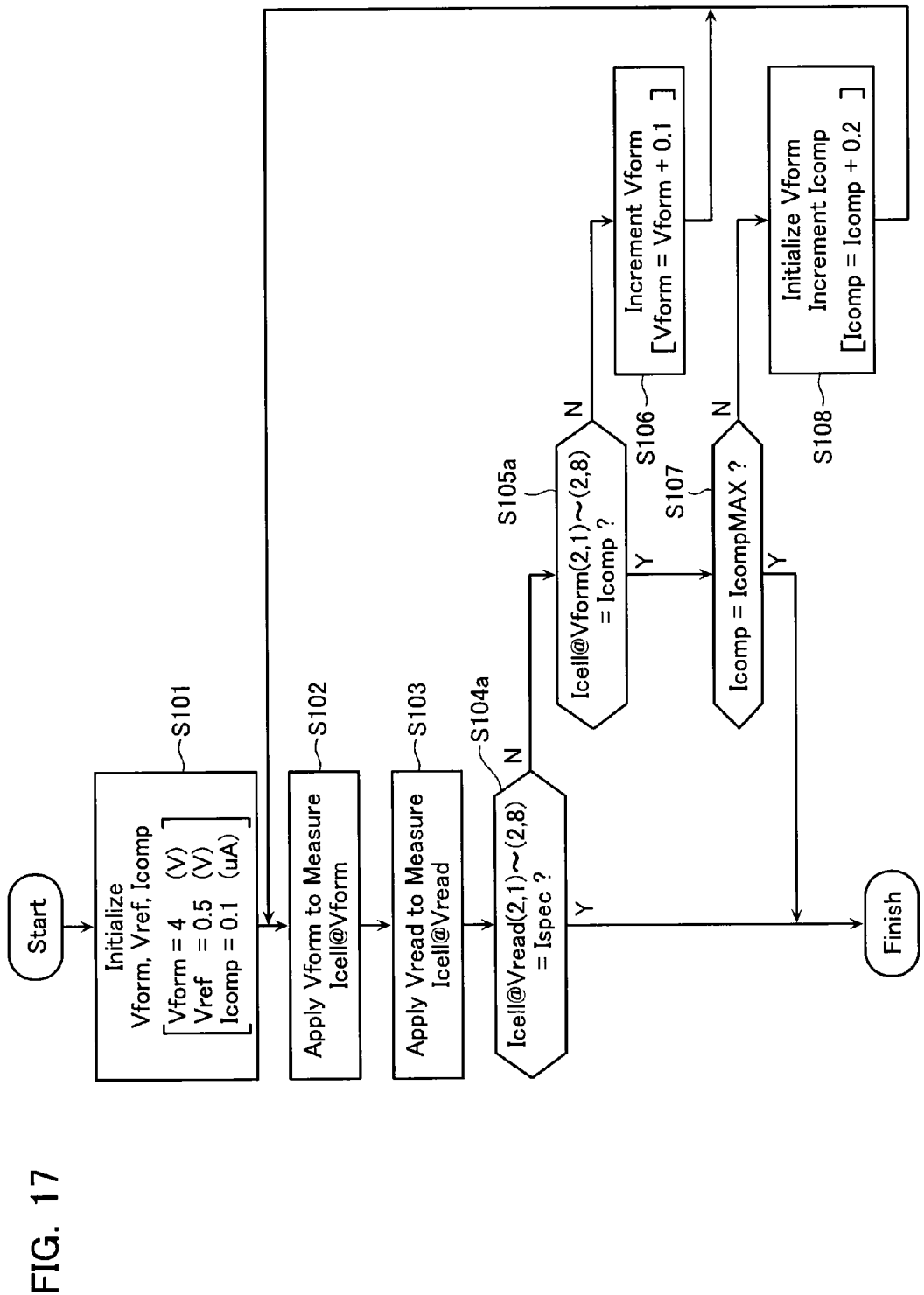
FIG. 17 is a flowchart showing a forming operation by the column control circuit 203 in accordance with the fifth embodiment.

Next, a forming operation in accordance with the fifth embodiment is described with reference to FIG. 17. FIG. 17 is a flowchart showing the forming operation due to the column control circuit 203 in accordance with the fifth embodiment. In the fifth embodiment, subsequent to steps S101-S103, the column control circuit 203 judges whether or not the current value for all eight bits of the cell current Icell@Vread(2,1)-(2,8) is larger than the current value Ispec (step S104a). Now, if the current value for all eight bits of the cell current Icell@Vread(2,1)-(2,8) is judged to be larger than the current value Ispec (step S104a, Y), the column control circuit 203 terminates the forming operation.

On the other hand, if, in step S104a, the current value of the cell current Icell@Vread(2,1)-(2,8) is judged to be smaller than the current value Ispec (step S104a, N), the column control circuit 203 proceeds to execute step S105a. In step S105a, the column control circuit 203 judges whether or not the current value for all eight bits of the cell current Icell@Vform(2,1)-(2,8) has reached the compliance current Icomp. Now, if the current value for all eight bits of the cell current Icell@Vform(2,1)-(2,8) is judged to have reached the compliance current Icomp (step S105a, Y), the column control circuit 203 executes step S107. On the other hand, if the current value of the cell current Icell@Vform(2,1)-(2,8) is judged not to have reached the compliance current Icomp (step S105a, N), the column control circuit 203 executes step S108. Note that other processing shown in FIG. 17 is similar to that of the fourth embodiment.

Figure 18:
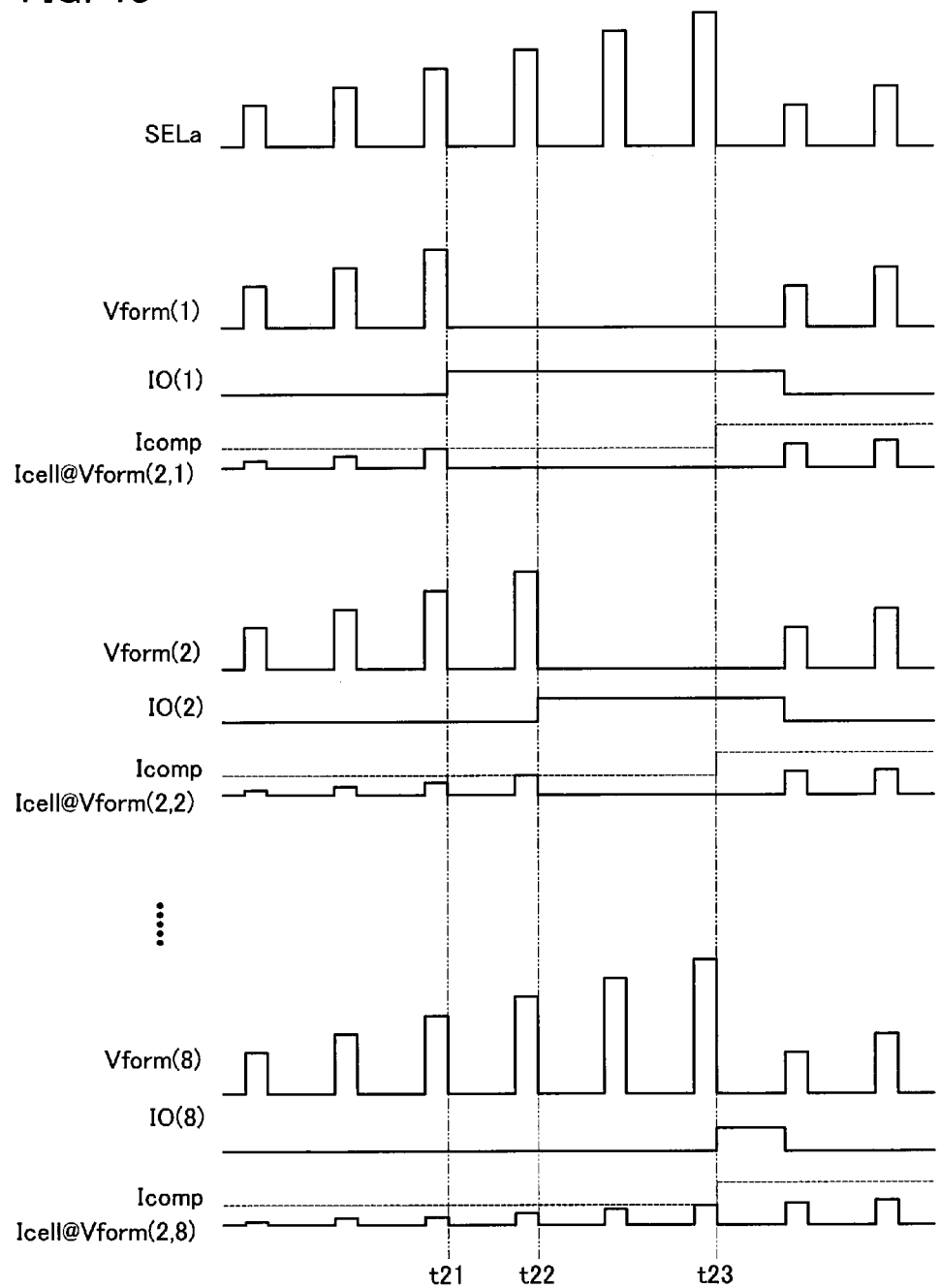
FIG. 18 is a timing chart showing the forming operation in the fifth embodiment.

FIG. 18 is a timing chart in accordance with the fifth embodiment. Note that the read voltage application operation R (read voltage Vread) shown in FIG. 12 is omitted from FIG. 18.

As shown in FIG. 18, in the fifth embodiment, the column control circuit 203 raises a voltage of the voltage SELa incrementally. As a result, the forming voltage Vform(1) is raised incrementally until time t21. Then, at time t21, the cell current Icell@Vform(2,1) reaches the compliance current Icomp. This causes the signal IO(1) to change from the "Low state" to the "High state". Additionally at time t21, the forming voltage Vform(1) is lowered to the ground voltage based on the signal IO(1). Specifically, the signal G_PCM causes the PMOS transistors pTr2 and pTr4 to be turned off (refer to FIG. 10), thereby allowing the forming voltage Vform to be lowered.

Subsequently, at time t22, the cell current Icell@Vform(2, 2) reaches the compliance current Icomp. This causes the signal IO(2) to change from the "Low state" to the "High state". Additionally at time t22, Vform(2) is lowered to the ground voltage based on the signal IO(2). Thereafter, the voltage SELa is raised incrementally until time t23, resulting in all of the signals IO(1)-(8) being changed from the "Low state" to the "High state". Further, at time t23, the compliance current Icomp is raised and the voltage of the voltage SELa is lowered to its initial value, based on the signals IO(1)-(8).

[Advantages]

The fifth embodiment allows the number of regulators 80 to be reduced compared to the fourth embodiment, whereby an occupied area in the fifth embodiment can be suppressed.

[Other Embodiments]

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, the transistors 22(1)-(n) in the third embodiment may be adopted also in the first embodiment. In addition, the current mirror circuit 20 need only be one capable of generating a current that is a times the cell current Icell at a certain timing, and is not limited to the one shown in the likes of FIG. 3. For example, instead of the current mirror circuit 20, the first to third embodiments may include an amplifier circuit configured to amplify a current a times.

What is claimed is:

1. A semiconductor memory device, comprising:
a memory cell array having memory cells disposed at intersections of a plurality of first lines and a plurality of second lines, each of the memory cells being includes by a rectifier and a variable resistor connected in series;
a control circuit configured to apply a first voltage to selected one of the first lines and to apply a second voltage having a voltage value smaller than that of the first voltage to selected one of the second lines, such that a certain potential difference is applied across the memory cell disposed at the intersection of the selected one of the first lines and the selected one of the second lines; and
a current limiting circuit configured to set a compliance current defining an upper limit of a cell current flowing in the memory cell, and to perform a control such that the cell current flowing in the memory cell does not exceed the compliance current,
the current limiting circuit comprising:
a current generating circuit configured to generate a first current having a current value equal to a current value of the cell current at a certain timing multiplied by a certain constant; and
a first current mirror circuit configured to mirror the first current to a current path supplying the first voltage to the first lines.

2. The semiconductor memory device according to claim 1, wherein the current generating circuit comprises:
a first transistor configured to allow the cell current to flow;
a second transistor mirror-connected to the first transistor and configured to generate the first current;
a capacitor having one end connected to gates of the first transistor and second transistor, and the other end connected to a terminal provided with a fixed potential; and
a first switch configured to short-circuit or disconnect a drain and the gate of the first transistor, and
wherein, at the certain timing, the first transistor is rendered in a non-conducting state, thereby disconnecting the drain and the gate of the first transistor.

3. The semiconductor memory device according to claim 2, wherein the first current mirror circuit starts a mirror operation of the first current at the certain timing.

4. The semiconductor memory device according to claim 2, wherein the second transistor includes a plurality of third transistors connected in parallel and having gates commonly connected,
wherein each of the plurality of third transistors is connected in series to a fourth transistor, and
wherein each of the fourth transistors is selectively on/off controlled based on a control signal.

5. The semiconductor memory device according to claim 1, further comprising a detection circuit configured to compare the first current and a reference current to output a comparison signal.

6. The semiconductor memory device according to claim 2, wherein the first current mirror circuit comprises:
a fifth transistor having a drain connected to a drain of the second transistor, and a source connected to an input terminal of the current limiting circuit;
a sixth transistor having a drain connected to the current path, a source connected to the input terminal of the current limiting circuit, and a gate connected to a gate of the fifth transistor; and
a second switch configured to short-circuit or disconnect the drain and the gate of the fifth transistor.

7. The semiconductor memory device according to claim 6, wherein the current limiting circuit further comprises a second current mirror circuit configured to mirror the cell current,
wherein the second current mirror circuit comprises:
a seventh transistor having a source connected to the drain of the sixth transistor and is configured to allow the cell current to flow in the first lines; and
an eighth transistor having a gate connected to a drain and a gate of the seventh transistor and is configured to allow the cell current to flow in the first transistor, and
wherein the first current mirror circuit further comprises a ninth transistor having a drain connected to a source of the eighth transistor, a source connected to the input terminal of the current limiting circuit, and a gate connected to the gate of the fifth transistor and the gate of the sixth transistor.

8. The semiconductor memory device according to claim 5, wherein the detection circuit comprises:
a third current mirror circuit configured to mirror the reference current;
an inverter having an input terminal connected to a node supplied with the reference current, and is configured to output the comparison signal from an output terminal; and
a tenth transistor provided between the node and a fixed potential and having a gate connected to the gates of the first transistor and the second transistor.

9. The semiconductor memory device according to claim 8, wherein the current generating circuit comprises:
a first transistor configured to allow the cell current to flow;
a second transistor mirror-connected to the first transistor and configured to generate the first current;
a capacitor having one end connected to gates of the first transistor and second transistor, and the other end connected to a terminal of fixed potential; and
a first switch configured to switch between short-circuiting and disconnecting between a drain and the gate of the first transistor, wherein, at the certain timing, the first transistor is rendered in a non-conducting state, thereby disconnecting the drain and the gate of the first transistor, wherein the second transistor includes a plurality of third transistors connected in parallel and having gates commonly connected, wherein each of the plurality of third transistors is connected in series to a fourth transistor, and wherein each of the fourth transistors is selectively on/off controlled based on a control signal.

10. The semiconductor memory device according to claim 1, wherein the variable resistor is configured to undergo transition between at least two resistance states of a low-resistance state and a high-resistance state.

11. A semiconductor memory device, comprising:

a memory cell array having memory cells disposed at intersections of a plurality of first lines and a plurality of second lines, each of the memory cells including a variable resistor; and a control circuit configured to apply a certain voltage to selected one of the first lines and to selected one of the second lines, and thereby apply a voltage to the memory cell disposed at the intersection of the selected one of the first lines and the selected one of the second lines, in a forming operation for rendering the memory cell in a state where transition is possible between a high-resistance state and a low-resistance state, the control circuit repeatedly executing a first processing and a second processing based on a first cell current flowing in the memory cell when a first voltage is applied to the memory cell, the first processing being an operation of raising the first voltage by a certain amount if the first cell current is judged not to have reached a limiting current, and the second processing being an operation of raising the limiting current and lower the first voltage to an initial value if the first cell current is judged to have reached the limiting current.

12. The semiconductor memory device according to claim 11, wherein the control circuit is configured such that a different limiting current is settable for each of the plurality of first lines, and wherein, in the second processing, the control circuit is configured such that, if the first cell current flowing from one of the plurality of first lines is judged to have reached the limiting current set therefor, a value of the limiting current set therefor is raised by a certain amount.

13. The semiconductor memory device according to claim 11, wherein the control circuit is configured such that a common limiting current is settable in the plurality of first lines, and wherein, in the second processing, the control circuit is configured such that, if all of the first cell currents flowing from the respective first lines are judged to have reached the limiting current, a value of the limiting current is raised by a certain amount.

14. The semiconductor memory device according to claim 11, wherein the control circuit, subsequent to applying the first voltage to the memory cell, applies to the memory cell a second voltage required for reading a state of the memory cell, and detects a second cell current flowing in the memory cell when the second voltage is applied, and wherein the control circuit terminates the first processing and the second processing when the second cell current is judged to have exceeded a certain value.

15. The semiconductor memory device according to claim 14, wherein the first voltage is larger than the second voltage.

16. The semiconductor memory device according to claim 11, wherein the control circuit terminates the first processing and the second processing when the limiting current is judged to have reached a certain value.

17. The semiconductor memory device according to claim 12, wherein the control circuit comprises:

a plurality of sense amplifiers, each configured to supply the first cell current to each of the first lines and to generate the control current; and a plurality of regulators, each configured to regulate a voltage value of a regulating voltage for determining a voltage value of the limiting current, and to supply the regulating voltage to each of the sense amplifiers.

18. The semiconductor memory device according to claim 13, wherein the control circuit comprises:

a plurality of sense amplifiers, each configured to supply the first cell current to each of the first lines and to generate the control current; and a regulator configured to regulate a voltage value of a regulating voltage for determining a voltage value of the limiting current, and to supply a common regulating voltage to the plurality of sense amplifiers.

19. The semiconductor memory device according to claim 11, wherein the control circuit charges the first lines prior to executing the forming operation.

20. The semiconductor memory device according to claim 11, wherein each the variable resistor is configured to undergo transition between at least two resistance states of a low-resistance state and a high-resistance state.

* * * * *